United States Patent [19]

Harns

[11] Patent Number: 4,460,997
[45] Date of Patent: Jul. 17, 1984

[54] MEMORY TESTER HAVING MEMORY REPAIR ANALYSIS CAPABILITY

[75] Inventor: Timothy Harns, Freemont, Calif.

[73] Assignee: Pacific Western Systems Inc., Mountain View, Calif.

[21] Appl. No.: 283,366

[22] Filed: Jul. 15, 1981

[51] Int. Cl.$^3$ ............................................. G06F 11/20
[52] U.S. Cl. ........................................ 371/10; 371/21
[58] Field of Search ................................... 371/10, 21

[56] References Cited

U.S. PATENT DOCUMENTS

| 3,995,261 | 11/1976 | Goldberg | 371/10 |
| 3,999,051 | 12/1976 | Petschauer | 371/10 |
| 4,047,163 | 9/1977 | Choate et al. | 371/10 |
| 4,380,066 | 4/1983 | Spencer et al. | 371/10 |

FOREIGN PATENT DOCUMENTS

| 34198 | 4/1981 | Japan | 371/10 |

OTHER PUBLICATIONS

Mano, *Computer System Architecture*, Prentice-Hall, Englewood Cliffs, N.J., 1976.
Huber, "The 64K Ram: A Fault-Tolerant Semiconductor Memory Design", *Bell Labs Record*, vol. 57, No. 7, Jul./Aug. 1979.

Primary Examiner—Charles E. Atkinson
Assistant Examiner—Michael R. Fleming
Attorney, Agent, or Firm—Harry E. Aine

[57] ABSTRACT

A memory tester is disclosed for testing a matrix of memory elements, such matrix having spare rows and columns of memory elements to be used for repair of the memory under test. The memory tester tests the memory matrix to derive failure data and stores the failure data in corresponding rows and columns in a second memory matrix. Failure data in the second memory is scanned first by row and when the number of failures in any row exceeds the number of spare columns that row is flagged for replacement. Next, the columns of failure data are scanned and when the number of failures in any column exceeds the number of spare rows, that column is flagged for replacement. During the scan of the columns, previously flagged rows are masked such that failures which are to be repaired are not counted. Thereafter, with the flagged rows and column failures masked, the rows are again scanned and individual failures are flagged for replacement by remaining spare rows and columns until all spare rows and columns are used at which point detection of a subsequent failure flags the memory under test as non-repairable.

7 Claims, 21 Drawing Figures

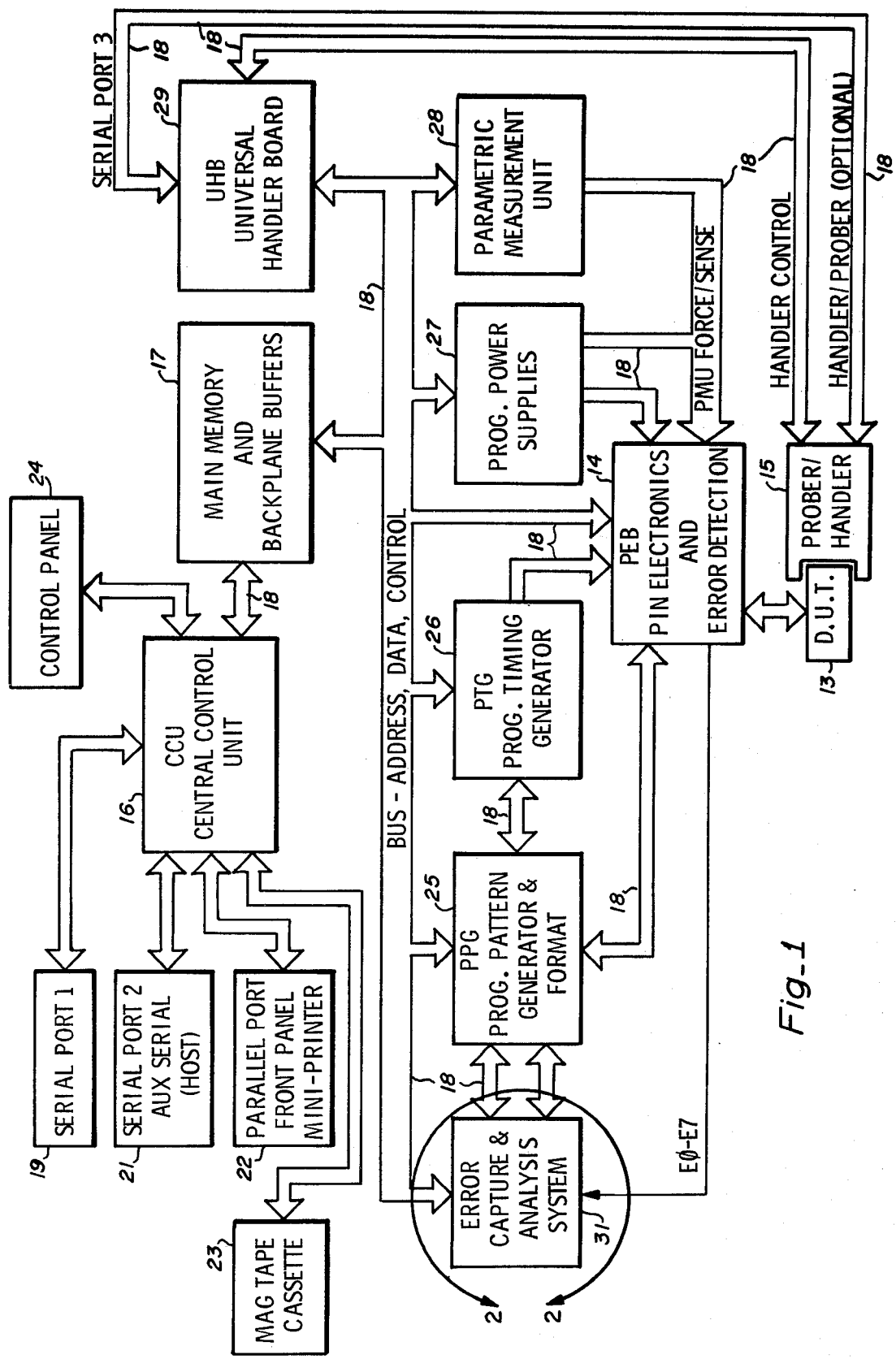
Fig_1

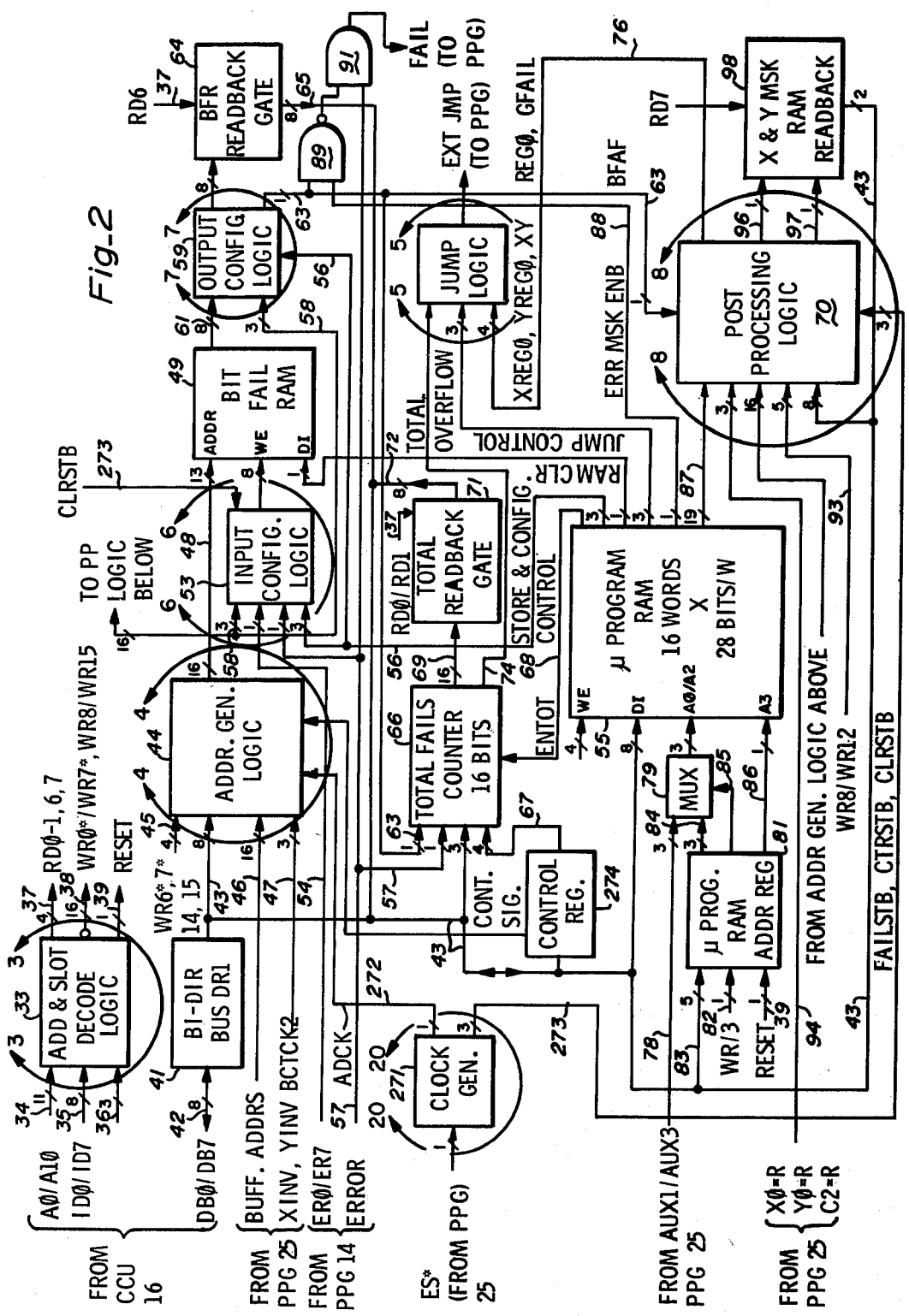

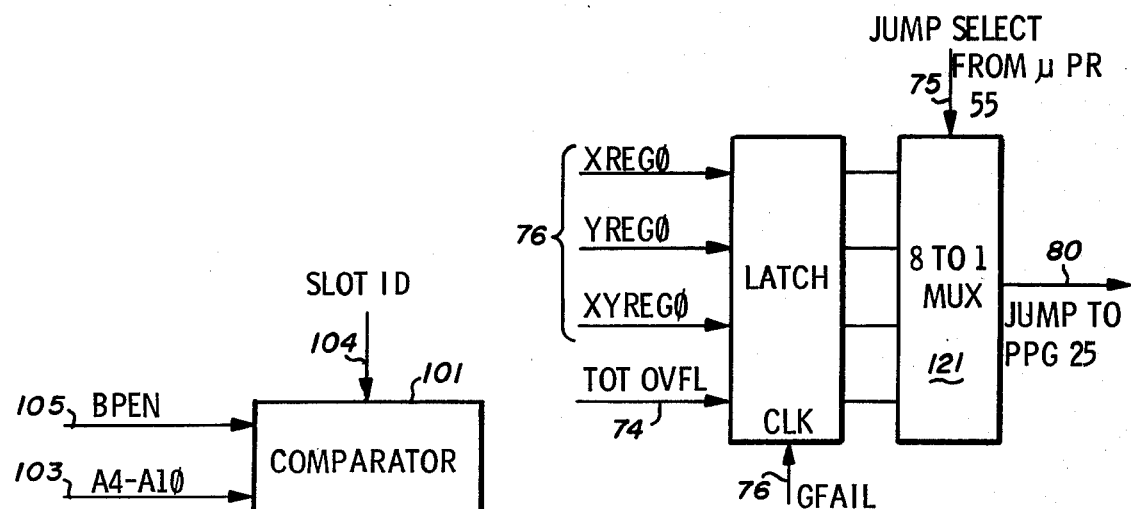
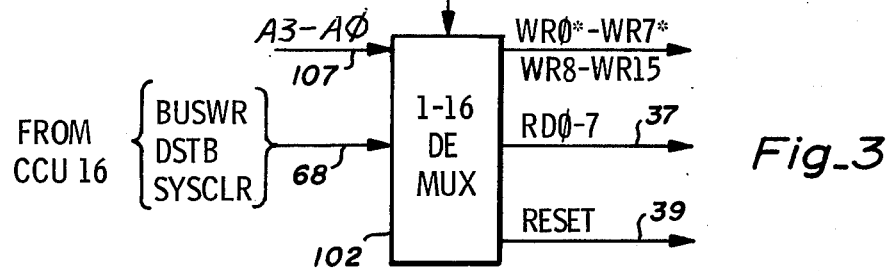
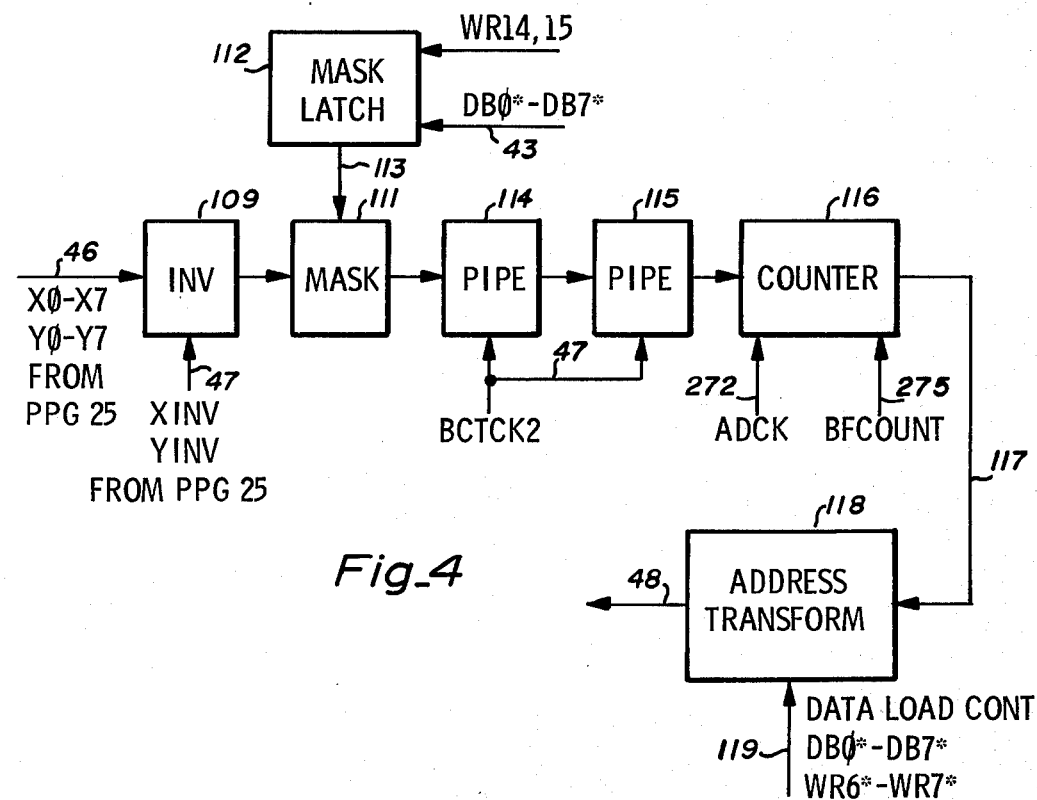

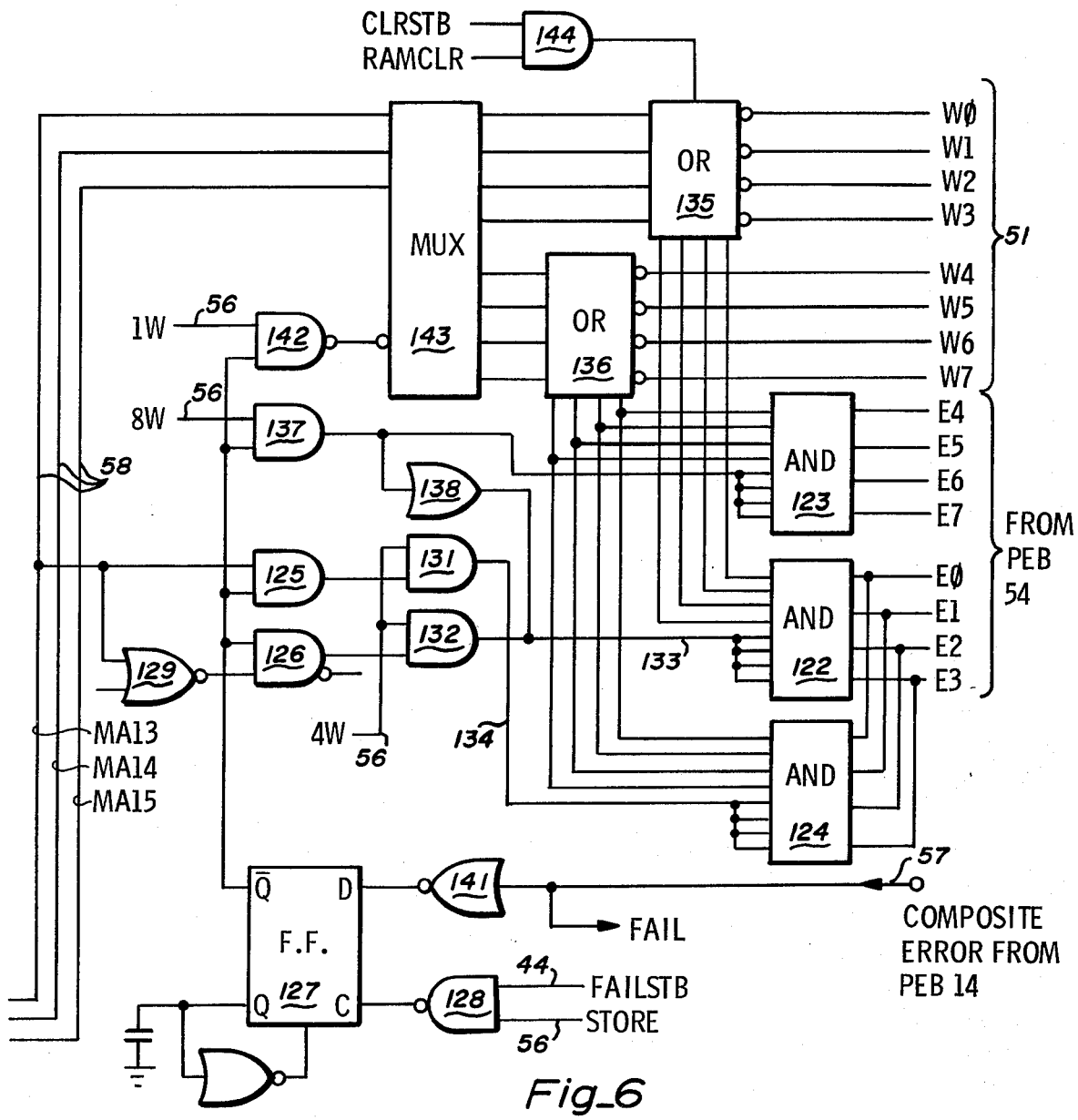
Fig_6
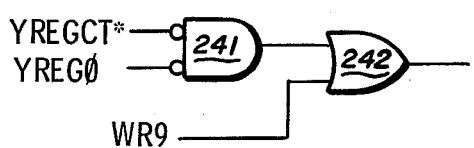
Fig_10

Fig_8A

Fig_8B

Fig. IIA

Fig. IIB

Fig. IIC

Fig. IID

64 BIT MEMORIES WITH FAILURES

| BYTE | 7 | 6 | 5 | 4 | 3 | 2 | 1 | 0 |
|---|---|---|---|---|---|---|---|---|
| 1 | CTR SCR1 | X MSK ENB | X MUX SEL | | Y REG CNTL | | Y CTR CNTL | |
| | | | XMR2 | XMR1 | YREG2 | YREG1 | YCTR2 | YCTR1 |
| 2 | CTR SCR2 | Y MSK ENB | Y MUX SEL | | X REG CNTL | | XCTR CNTL | |
| | | | YMR2 | YMR1 | XREG2 | XREG1 | XCTR2 | YCTR1 |
| 3 | STORE | ERROR MSK ENB | RAM CLR | STORE MSK | BFRA CONFIG. | | CNTR CLR MODE | |
| | | | | | 8W | 4W | S2 | S1 |
| 4 | | | | | ENB TOTAL | JUMP CONTROL | | |
| | | | | | | JC4 | JC2 | JC1 |
Fig_13    μPR - BIT DEFINITION
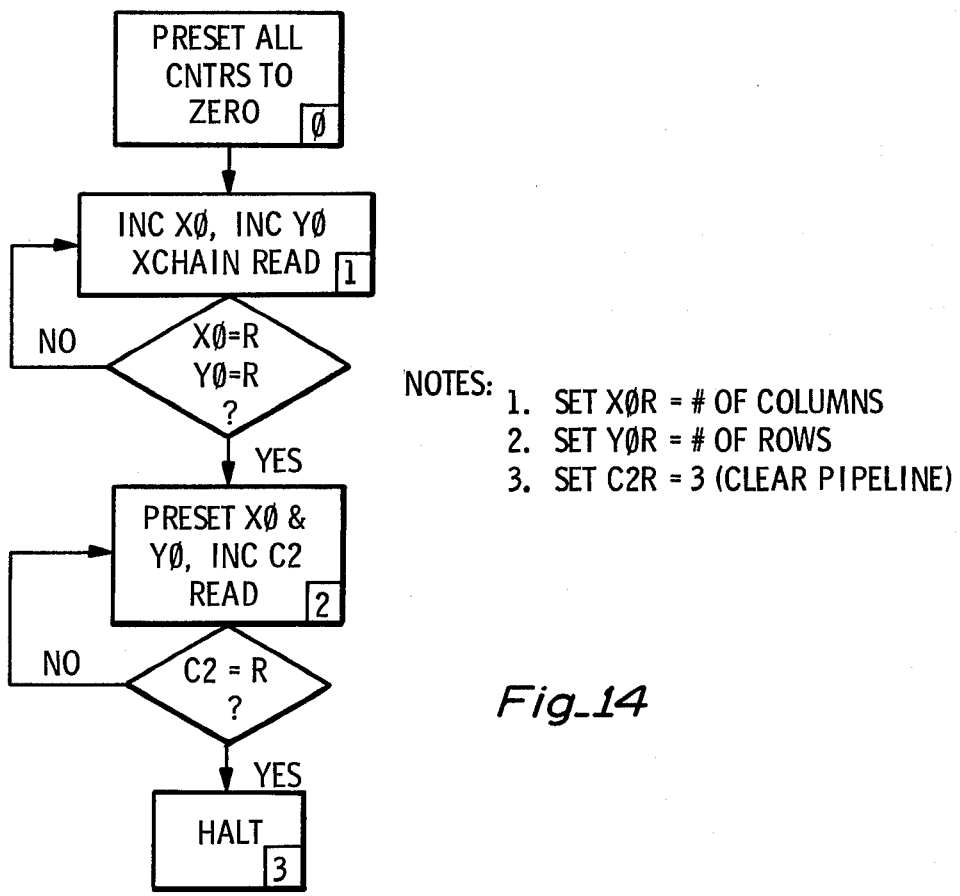
NOTES:
1. SET XØR = # OF COLUMNS
2. SET YØR = # OF ROWS
3. SET C2R = 3 (CLEAR PIPELINE)
Fig_14

| SUB-ADDR DEC. HEX | | WRITE (BUS WR=HI) | | | | | | | | READ (BUS WR=LO) | | | | | | | |
|---|---|---|---|---|---|---|---|---|---|---|---|---|---|---|---|---|---|
| DEC. | HEX | BIT 7 | BIT 6 | BIT 5 | BIT 4 | BIT 3 | BIT 2 | BIT 1 | BIT 0 | BIT 7 | BIT 6 | BIT 5 | BIT 4 | BIT 3 | BIT 2 | BIT 1 | BIT 0 |
| 0 | 0 | | | BOARD RESET (ANY BIT) | | | | | | | | TOTALIZER CNTR-BITS 0-7 | | | | | |
| 1 | 1 | CTRSCR1 | X MSK ENB | μPROG. RAM-BYTE 1 X MSKSCR → Y REG | | | | → Y CTR | | | | TOTALIZER CNTR-BITS 8-15 | | | | | |
| 2 | 2 | CTRSCR2 | Y MSK ENB | μPROG. RAM BYTE 2 Y MSKSCR → X REG | | | | → X CTR | | | | | | | | | |
| 3 | 3 | STORE | MSK ENB | μPROG. RAM BYTE 3 ERR STORE ← CONFIG RAMCLR | MSK | | | CTR CLR MODS S2  S1 | | | | | | | | | |
| 4 | 4 | | | μPROG. RAM BYTE 4 | | | ENTOT | JUMP CONT JC4  JC2 | JC1 | | | | | | | | |
| 5 | 5 | | | IFCOMP ← TOTALIZER→RASTER BF CNT RDMSK ENB. BYTE 1 BYTE 0. ENB. | | | | | | | | | | | | | |
| 6 | 6 | 7 ↓ | | ↓ X7 | X TRANSFORM RAM | | | | → 0 | 7 | | BIT FAIL RAM ARRAY | | | | | |
| 7 | 7 | 7 ↓ | | ↓ | Y TRANSFORM RAM | | | | → 0 | | | | | | | | |
| 8 | 8 | 7 ↓ | | | Y COUNTER | | | | → 0 | | | | | | | | |
| 9 | 9 | 7 ↓ | | | YREGISTER | | | | → 0 | | | | | | | | |
| 10 | A | 7 ↓ | | | X COUNTER | | | | → 0 | | | | | | | | |
| 11 | B | 7 ↓ | | | X REGISTER | | | | → 0 | | | | | | | | |
| 12 | C | | | | BFCK (ANY BIT) | | | | | | | | | | | | |
| 13 | D | | | | μPR ADDLD | μPR. ADDR. A3 | | | A0 | | | | | | | | |
| 14 | E | | | ↓ X7 | | | X ADDR. MSK | | X2 | | | | | | | YMSK X MSK | 0 |
| 15 | F | | | ↓ Y7 | | | Y ADDR. MSK | | Y2 | | | | | | | | |

COMMENT:

SLOTS (DEC.)     SLOT CODE (HEX)
COLT: J11     F0B
FOX:

Fig_15

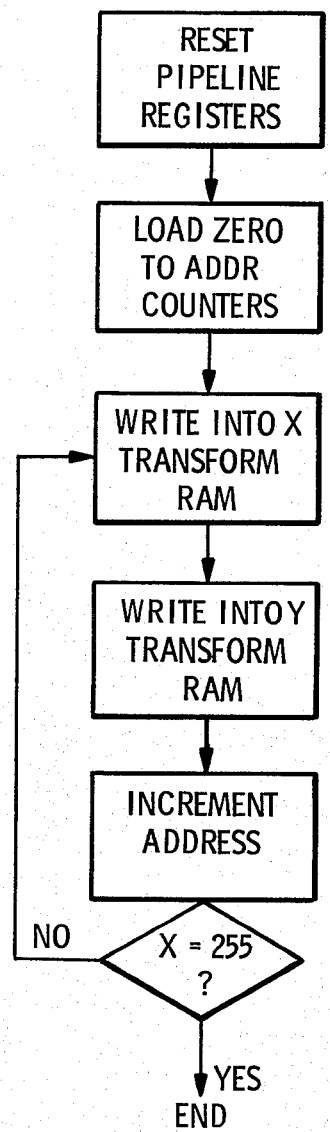
LOADING TRANSFORM RAM-FLOW CHART
Fig_16
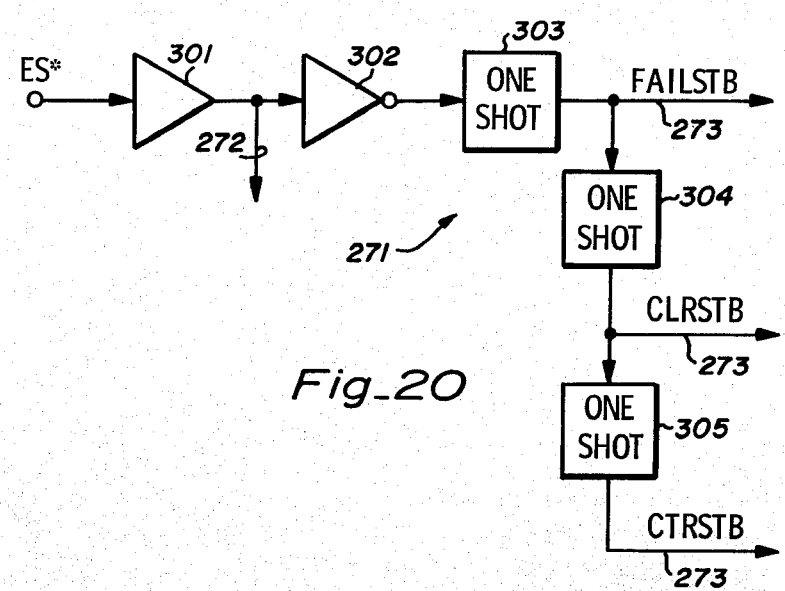
Fig_20

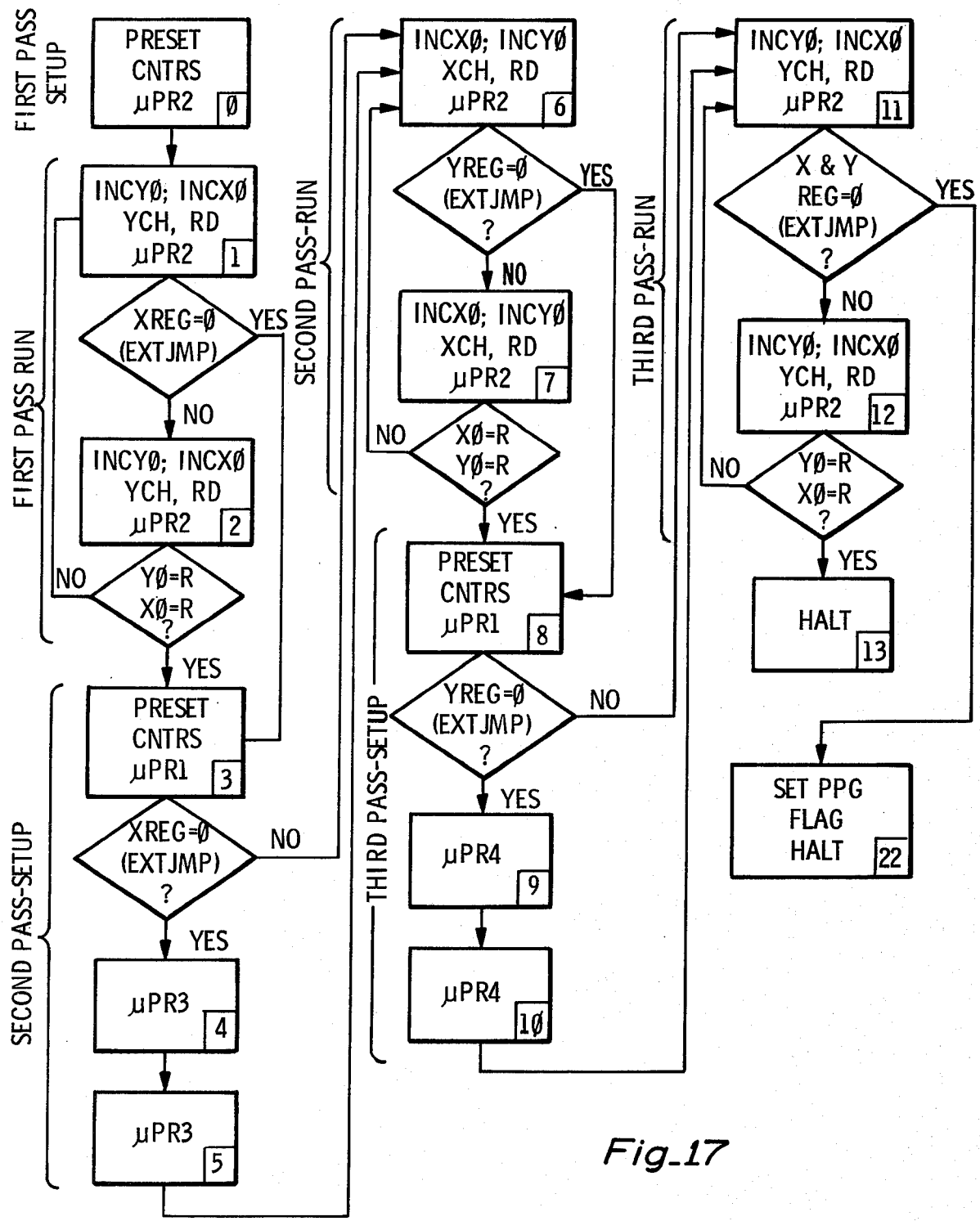
PATTERN GENERATOR LOGIC FLOW CHART
Fig_17

PROGRAM MEMORY CODING

Fig.18A

Fig_18B

RAM CODING
STARTING (PS) AND ENDING (REG) VALUES AND DATA FOR RAMS

| RAM | ADDR | DATA | RAM | ADDR | DATA | | |
|---|---|---|---|---|---|---|---|
| MASK RAM | 0 | | XRAM | FUNC → | X1REG | X0REG | X0PS |
| | 1 | | | 0 | | | |
| | 2 | | | 1 | | | |
| | 3 | | YRAM | FUNC → | Y1REG | Y0REG | Y0PS |
| | 4 | | | 0 | | | |
| | 5 | | | 1 | | | |
| | 6 | | C2 LRAM | FUNC → | C2 REG | | |
| | 7 | | | 0 | | | |
| | 8 | | | 1 | | | |
| | 9 | | C3 LRAM | FUNC → | C3 REG | | |
| | 10 | | | 0 | | | |
| | 11 | | | 1 | | | |
| | 12 | | DRAM | FUNC → | DATA | | |
| | 13 | | | 0 | | | |
| | 14 | | | 1 | | | |
| | 15 | | | | | | |

COUNTER CODING

| OPERATION | B | A |
|---|---|---|
| HOLD | 0 | 0 |
| DECREMENT | 0 | 1 |
| INCREMENT | 1 | 0 |
| PRESET | 1 | 1 |

JUMP CONTROL CODING

| JEN | CODE | JUMP CONDITIONS | | |
|---|---|---|---|---|
| | | CHAIN BIT | | |
| | 48 47 46 45 | X CHAIN | Y CHAIN | |
| 0 | 0 | - | - | NO JUMP |
| 1 | 1 | - | 0 | X0 NOT EQUAL TO REG |
| | | - | 1 | Y0 = R AND X0 = R (Y CHAINED TO X) |
| 2 | 2 | - | 0 | X1 NOT EQUAL TO REG |
| | | - | 1 | Y1 = R AND X1 = R (Y CHAINED TO X) |
| 3 | 3 | 0 | - | Y0 NOT EQUAL TO REG |
| | | 1 | - | X0 = R AND Y0 = R (X CHAINED TO Y) |
| 4 | 4 | 0 | - | Y1 NOT EQUAL TO REG |
| | | 1 | - | X1 = R AND Y1 = R (X CHAINED TO Y) |
| 5 | 5 | - | - | C2 NOT EQUAL TO REG |
| 6 | 6 | - | - | C3 NOT EQUAL TO REG |
| 7 | 7 | - | 0 | X0 NOT EQUAL TO X1 |
| | | - | 1 | Y0 = Y1 AND X0 = X1 (Y CHAINED TO X) |
| 8 | 8 | 0 | - | Y0 NOT EQUAL TO Y1 |
| | | 1 | - | X0 = X1 AND Y0 = Y1 (X CHAINED TO Y) |
| 9 | 9 | - | - | DATA TOGGLE = 1 |
| 10 | A | - | - | SPARE |
| 11 | B | - | - | XINV TOGGLE = 1 |
| 12 | C | - | - | YINV TOGGLE = 1 |
| 13 | D | - | - | FAIL |
| 14 | E | - | - | UNCONDITIONAL |
| 15 | F | - | - | HALT |

Fig. 19

| DEC. ADDR | BYTE 4 | | BYTE 3 | | | | | | BYTE 2 | | | | | BYTE 1 | | | | | COMMENTS |
|---|---|---|---|---|---|---|---|---|---|---|---|---|---|---|---|---|---|---|---|
| | 27 ENB TOT | 26-24 JMPCOTL (4,2,1) | 23 STORE | 22 ERRMSK ENB | 21 RAM CLR | 20 STORE MSK | 19-18 CONFIG CNTR (8,4) | 17-16 CNTR CLR (S2,S1) | 15 CS R2 | 14 YMSK ENB | 13-12 YMR (2,1) | 11-10 YREG (2,1) | 9-8 XCTR (2,1) | 7 CS R1 | 6 XMSK ENB | 5-4 XMR (2,1) | 3-2 YREG (2,1) | 1-0 YCTR (2,1) | |
| 0 | | | | | | | | | | | | | | | | | | | |
| 1 | | 0 | | | 0 | | 3 | | | 0 | 0 | | | | 0 | | 3 | | PRESET |
| 2 | | 3 | | | 1 | | 1 | | | 0 | 8 | 8 | | | 8 | | 1 | | PASS I |
| 3 | | 2 | | | 1 | | 1 | | | 8 | | 1 | 8 | | 4 | | 8 | | PASS II |
| 4 | | 1 | | | 1 | | 1 | | | 7 | | 8 | | | 7 | | 8 | | PASS III |
| 5 | | | | | | | | | | | | | | | | | | | |
| 6 | | | | | | | | | | | | | | | | | | | |
| 7 | | | | | | | | | | | | | | | | | | | |
| 8 | | | | | | | | | | | | | | | | | | | |
| 9 | | | | | | | | | | | | | | | | | | | |
| 10 | | | | | | | | | | | | | | | | | | | |
| 11 | | | | | | | | | | | | | | | | | | | |
| 12 | | | | | | | | | | | | | | | | | | | |
| 13 | | | | | | | | | | | | | | | | | | | |
| 14 | | | | | | | | | | | | | | | | | | | |
| 15 | | | | | | | | | | | | | | | | | | | |

NOTES:
1. PRESET THE Y CNTR TO 0
2. PRESET THE Y REG TO THE No. OF SPARE ROWS = 4
3. PRESET THE X CNTR TO 0
4. PRESET THE X REG TO THE No. OF SPARE COLUMNS = 4

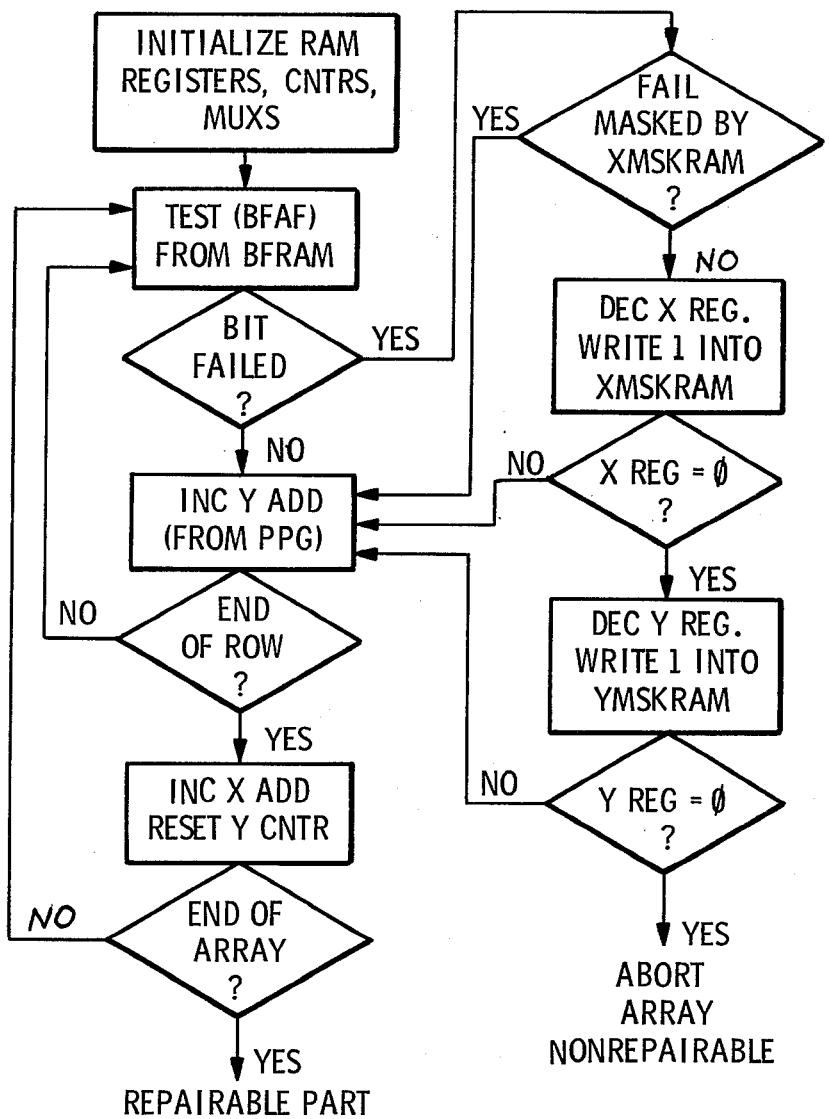
FLOW CHART OF 3rd PASS ALGORITHM
Fig_21

MEMORY TESTER HAVING MEMORY REPAIR ANALYSIS CAPABILITY

BACKGROUND OF THE INVENTION

The present invention relates in general to memory testers and, more particularly, to an improved memory tester having repair analysis capability.

DESCRIPTION OF THE PRIOR ART

Heretofore, memory testers have been proposed wherein a memory matrix under test was electrically tested by means of a pattern generator generating a sequence of addresses for accessing and exercising the memory matrix under test in accordance with certain predetermined or random test patterns. The failure data resulting from the memory under test was then stored in a second memory in accordance with the row and column address of the element under test. A central processing unit (CPU) in a first pass processed the failure data by first scanning the rows and tabling the number of errors per row. This tabled data is then scanned by the CPU to derive a second table of the addresses of those rows having more failures than a predetermined number, R. Initially, R equals the number of spare columns. The CPU then writes zeros into the rows of the second memory which are listed in the second table, thereby at least partially repairing the image of the device under test as stored in the second memory. If there are more rows in the second table than spare rows then those excess rows are not repaired.

In a second pass the CPU scanned the second memory column-by-column tabling the number of failures per column. This table was then scanned for the addresses of columns having more failures than a predetermined number, C, initially set to equal the number of spare rows. However, C is decremented by the number of rows repaired in the first pass or by one if no rows were repaired. These addresses are stored in a second table. The memory image in the second memory is then at least partially repaired by writing zeros into the column addresses in the second table but repairing no more addresses than the number of spare columns available. The number R is then decremented by the number of columns repaired or by one if no columns were repaired.

In a third pass the CPU scans the failure data row-by-row and tables the failures per row. This data is then scanned to generate a second table of addresses of rows having more failures than the number R. These addressed rows, if any, are then at least partially repaired by writing into the memory zeros for each such row. However, the number of such repaired rows cannot exceed the number of spare rows.

The CPU then makes a fourth pass through the 2nd memory array tabling the addresses of columns that contain more failures than the number C. This pass is then identical to the second pass except the value of C is less.

The CPU then continues to make additional passes similar to pass one and two except that R and C are decremented by either one or the number of repairs made on the previous pass. This continues until either a pass is made with no failures being found in the 2nd memory array or until the number of spare rows and columns remaining goes to zero.

If a pass is made and no failures are found then the memory under test is considered repairable and the addresses used to repair the 2nd memory are stored for use in repairing the memory under test. If the number of spare rows and columns remaining goes to zero then the 2nd memory is scanned one more time. If any failures are found the memory is considered nonrepairable. If no failures are found the memory under test is repairable using the same addresses that were used to repair the 2nd memory on all the previous passes.

The problem with this prior art system is that the failure analysis and repair is excessively time consuming in that the CPU cycle time is relatively long and, in addition, the analysis is interrupted by repair of rows and columns in the second memory before the device under test is determined to be repairable.

SUMMARY OF THE PRESENT INVENTION

The principal object of the present invention is the provision of an improved memory tester having memory repair and analysis capability.

In one feature of the present invention, row and column failure data which is flagged to be replaced by spare rows and columns is masked so that the failure data under analysis is analyzed as though those failures have been corrected by the replacement of such rows and columns even though such repair has not as yet been effected, whereby the repairability analysis is not interrupted by actual repair of the storage memory.

In another feature of the present invention, the memory failure data is scanned row by row and rows are flagged for replacement when the number of failures per row exceeds the number of unused spare columns, thereafter the columns are scanned for failure, a column is flagged for replacement when the number of failures per column exceeds the number of unused spare rows, thereafter the matrix array is scanned row by row for single failures such failure data being masked for previously flagged rows and columns and detected single bit failures per row are flagged for replacement by a spare row or column, whereby with a relatively few number of passes through the failure data the repairability of the memory under test is rapidly ascertained.

Other features and advantages of the present invention will become apparent upon a perusal of the following specification taken in connection with the accompanying drawings wherein:

BRIEF DESCRIPTION OF THE DRAWINGS

FIG. 1 is a schematic block diagram of a memory tester incorporating features of the present invention, FIG. 2 is a schematic block diagram of a portion of the circuit of FIG. 1 delineated by line 2—2, FIG. 3 is a schematic block diagram of a portion of the circuit of FIG. 2 delineated by line 3—3, FIG. 4 is a schematic block diagram of a portion of the circuit of FIG. 2, delineated by line 4—4, FIG. 5 is a schematic block diagram of a portion of the circuit of FIG. 2 delineated by line 5—5, FIG. 6 is a schematic block diagram of a portion of the circuit of FIG. 2 delineated by line 6—6, FIG. 8 is a schematic block diagram of a portion of the circuit of FIG. 2 delineated by line 8—8.

FIG. 13 is a coding chart for the programmable RAM of FIG. 2,

FIG. 14 is a logic flow diagram for the programmable pattern generator portion of the circuit of FIG. 1, FIG. 15 is a control map for the COLT operating system stored in the memory of the CCU of FIG. 1, FIG. 16 is a program logic flow diagram for loading the transform RAM, FIG. 17 is a program logic flow diagram for programming the $\mu$ program RAM of the programmable pattern generator so as to control the error capture and analysis system, FIG. 18 is a coding chart for the programmable pattern generator to run the post processing algorithm, FIG. 19 is a coding chart for programming the error capture and analysis system to perform the post processing algorithm, FIG. 20 is a schematic block diagram of that portion of the circuit of FIG. 2 delineated by line 20—20, and FIG. 21 is the program logic flow diagram for the third pass algorithm.

DESCRIPTION OF THE PREFERRED EMBODIMENTS

Figure 7:
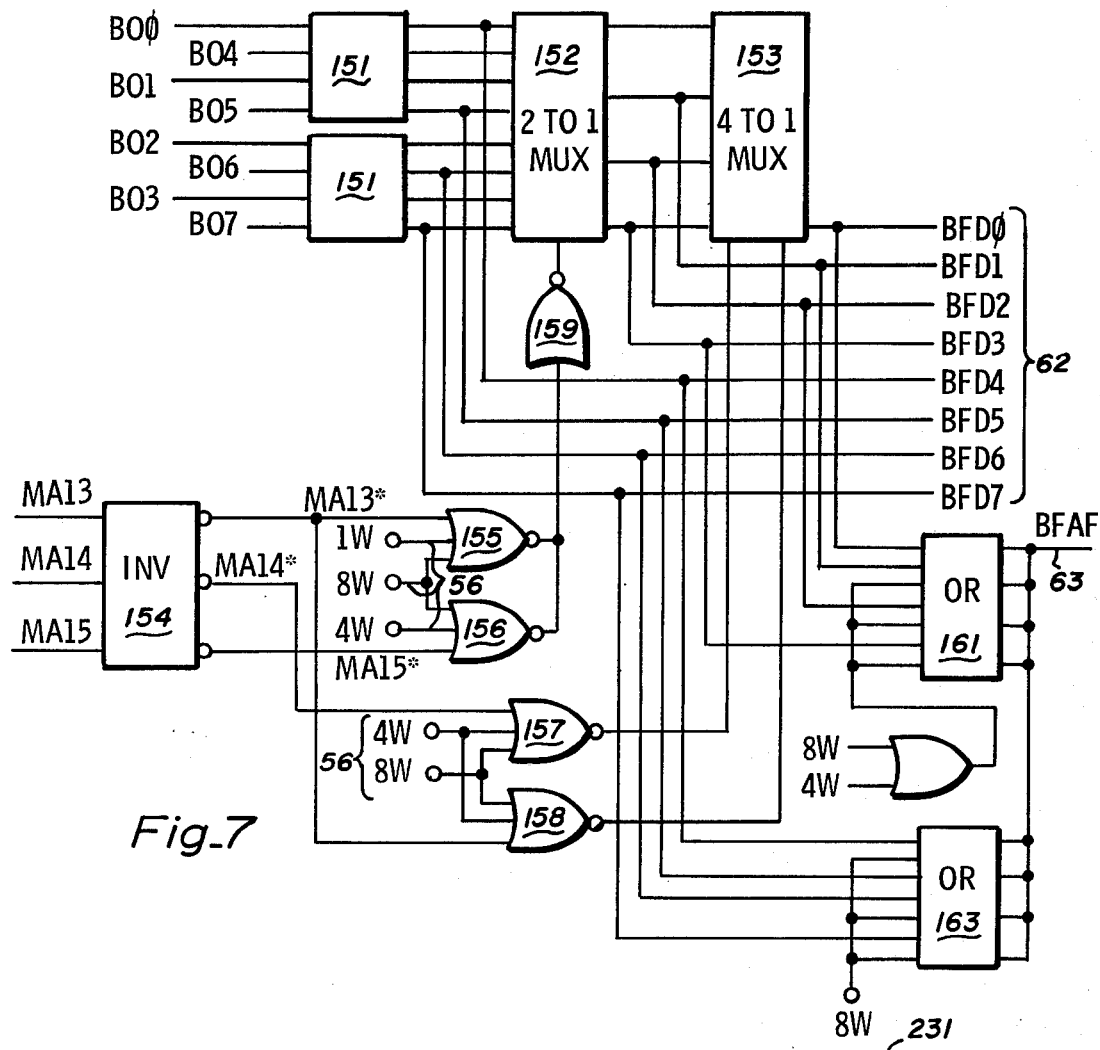
FIG. 7 is a schematic block diagram of a portion of the circuit of FIG. 2 delineated by line 7—7.

Referring now to FIG. 1, there is shown in block diagram form, a memory tester 11 incorporating features of the present invention. That portion of the memory tester 11 enclosed within box 12 comprises the conventional prior art memory tester, such as a COLT memory test system commercially available from Pacific Western Systems, Inc. of Mountain View, Calif.

Briefly, the conventional memory tester 12 includes a memory device under test 13 which plugs into a pin electronics and error detection circuit board 14 for making electrical connections to and from the memory device under test 13. The actual connections between the memory device under test 13 and the pin electronics board 14 may also be made by means of a wafer sort prober such that the memory device under test 13 may be tested in the semiconductor wafer form, i.e., before dicing. In such a case the electrical connections between the memory device under test 13 and the pin electronics board 14 would be made by means of the probes of the wafer sort prober 15, such as a PROBE II wafer sort prober commercially available from Pacific Western Systems, Inc. of Mountain View, Calif. In case the memory devices under test are packaged devices, i.e., devices in packages with pins, such devices are connected to the pin electronics and error detection board 14 via the intermediary of a device handler of conventional design.

Once the memory device under test 13 has been electrically connected to the pin electronics and error detection board 14 it is tested under the control of a central control unit 16, utilizing a model 8088 microprocessor commercially available from Intel of Santa Clara, Calif. The central control unit 16 has a main memory 17 for interfacing the central control unit 16 to a back plane bus 18. The pin electronics and error detection circuit board 14 is also connected to the back plane bus 18.

Four input/output ports 19, 21, 22 and 23 are provided for inputing and outputing data to and from the central control unit 16. In a first one of these ports 19, a video keyboard terminal is provided for programming the central control unit for changing existing program data. Port 21 allows a host computer to be accessed to the central control unit 16 for loading and saving test program data from a floppy disc storage of the host computer.

Port 22 is provided for interfacing the central control 16 with a printer for printing out pass/fail and summary data derived from testing of the memory device under test 13.

Port 23 is connected to a magnetic tape cassette recorder for loading and saving program data.

A front control panel 24 is connected into the central control unit 16 for initiating start of the test and for initiating start of the data summary. In addition, light emitting diodes are provided for visual indication of good/bad bin data, i.e., a particular part under test falls into one or more bins, (categories) in accordance with the results of the test. A light emitting diode on the front panel illuminates to indicate the bin result of the test.

A programmable pattern generator 25 is connected to the back plane bus 18 and provides address and clock signals to the pin electronics and error detection board 14 for exercising and testing the memory device under test 13. In addition, the programmable pattern generator 25 generates signals for comparison with the signals derived from the memory device under test to derive an error or fail signal within the electronics of the board 14. A program timing generator 26 supplies timing control and clock signals to the programmable pattern generator 25.

A programmable power supply 27 is connected to the back plane bus 18 and supplies various potentials to the pin electronics and error detection board 14. A parametric measurement unit 28 is connected to the back plane bus 18 and supplies forcing currents and measures resulting voltages on any pin or set of pins of the pin electronics and error detection board 14. Also, the parametric measurement unit 28, when commanded by the central control unit 16 provides a forcing voltage to the pin electronics and error detection circuit board 14 and measures the resultant current on any pin or set of pins.

In addition, the conventional memory tester 12 performs certain dc measurements on a single pin or groups of pins, such as power drain, leakage current, drive current and current sink information. The resultant data is then processed by the central control unit 16 to derive pass/fail summary information and so forth which is outputed to the various devices such as a host computer, the printer 22 or the magnetic tape cassette recorder 23.

A universal handler board 29 is connected to the back plane bus 18 and provides start test and end test data via buses to the water sort prober or handler 15.

The conventional memory tester 12, as thus far described, provides functional test of the memory device 13 under test by exercising the various addresses of the memory and reading back information therefrom indicative of pass or fail of the particular exercised memory address. The pin electronics board 14 includes the receives, drivers, buffers, and comparators for comparing the information derived from the programmable pattern generator 25 with the information derived from the memory device under test 13. The memory tester 12 is programmable for testing any types of memories, such as 64k by 1 part, 16k by 4 parts and 8k by 8 parts.

In the present invention, the conventional memory tester 12 is modified to include a memory repair analysis capability by connecting an error capture and analysis system 31 to the back plane bus 18. In addition, the error capture and analysis system 31 is interfaced to the programmable pattern generator 25 and to the pin electronics error detection board 14 for receiving the fail data. The error capture and analysis system 31 includes a memory for storage of the fail data in locations corresponding to the locations of the individual memory elements of the memory device under test. The error capture and analysis system 31 has two main modes of operation.

In a first test mode, the testing is stopped on a receipt of the first failure from the pin electronics and error detection circuit board 14 and the error capture system flags the CCU 16 of the failure. In this mode of operation, the DUT 13 is tested under programmable pattern generator 25 control, and the error capture and analysis system 31 stores the resultant failure data in its memory.

In the second mode of operation, the error capture analysis system 31 processes the error data stored in its memory to determine the repairability of the memory device under test 13. More particularly, the error capture and analysis system 31, interacting with the program pattern generator 25, addresses the failure data stored in the memory of the error capture system 31 and scans the memory row by row and if the number of failures per row exceeds the number of spare columns that particular row is flagged for replacement. Next, under program pattern generator 25 control, the error capture system 31 scans its memory column by column and, if the number of failures per column exceeds the number of spare rows remaining, that particular column is flagged for replacement. During the scanning of the column failure data the error capture system 31 masks out failures in those rows which have been previously flagged for replacement. Next, the error capture system 31, under address control from the program pattern generator 25 scans its memory for failure data row by row while masking out failures in flagged rows and columns. Single failures are sequentially flagged for replacement by a spare row and then by a spare column until all of the spare rows and columns have been used. Thereafter, a detected failure initiates a flag indicating that the particular memory device under test is non-repairable.

Referring now to FIG. 2 the error capture and analysis system 31 is shown in greater detail. More particularly, address and slot decoder logic circuit 33 interfaces the error capture and analysis system 31 to the CCU 16 via the back plane bus 18. Circuit 33 is shown in greater detail in FIG. 3 but, briefly, includes eleven address lines 34 interconnecting logic 33 and the back plane bus 18 for receiving address signals via the back plane bus 18 from the CCU 16 and its memory 17. In addition, a set of eight slot identification codes lines 35 interconnect logic 33 with the back plane bus 18 for enabling circuit logic 33. More particularly, the decoder logic circuit 33 includes identification logic which is compared against the eight identification bits coming in over lines 35 so that logic circuit 33 is only enabled if its internal code matches the code of the input signals received over line 35. In addition, a set of four input lines 36 interconnect the back plane bus 18 and logic circuit 33 for receiving from the CCU 16 via the back plane bus 18 data strobe (DSTB), bus write (BUSWR), system clear (SYSCLR), and back plane enable (BPEN) signals.

The output of logic circuit 33 includes a set of four read lines 37 for outputing read bits RD0, 1, 6 and 7. These read signals go to various other circuits in the error capture analysis system 31. Another output of the logic circuit 33 consists of a group of 16 lines for supplying write output bits WR0*-WR7* and WR8-WR15. A third output line 39 provides a reset output signal to various portions of the circuit of FIG. 2 as shown therein.

A bidirectional bus driver 41 is also connected to the back plane bus 18 via eight data lines 42 over which data signals are sent to and from the CCU 16 and its memory 17 and the error capture analysis circuit 31. The output of the bidirectional bus driver 41 is fed to an internal data bus 43 consisting of eight data lines. Internal data bus 43 is connected to one input of an address logic circuit 44 which is shown in greater in FIG. 4. Briefly, the address logic circuit 44 is responsive to the eight data signals on the data bus 43, four write bits namely WR6*,7*,14 and 15 at input 45, sixteen buffered address inputs derived over sixteen input lines 46 from the pattern generator 25, and three control signals XINV, YINV, and BCTCK2 derived over 3 input lines 47 from the pattern generator 25.

The output of the address logic 44 is 16 bits of memory address on sixteen output lines 48. Thirteen of these addresses are fed to an address input terminal of a bit fail random access memory (BFRAM) 49 such as sixteen 4k bits RAMS model 2147, commercially available from Intel of Santa Clara County. BFRAM 49 can be configured to correspond with any one of three different memory matrix configurations under test, namely, 64k by 1, 16k by 4 and 8k by k. When configured in the 64k by 1 configuration, there is one write enable input on one of the eight input lines 51 for each address of the memory under test. When the BFRAM 49 is configured for 16k by 4, there are four write enable inputs on lines 51 for each address in the BFRAM and when the BFRAM 49 is configured for 8k by 8 there are eight write enable bits on lines 51 for each address. These write enable inputs on lines 51 are derived from the output of an input logic circuit 53.

The BFRAM 49 includes emitter coupled logic (ECL) to transistor transistor logic (TTL) buffers on its inputs. A suitable input buffer is a model 10125 commercially available from Motorola. These buffers permit the TTL BFRAM to be interfaced to the other portions of the circuit which are of ECL type.

A data input line 52 supplies a RAM clear signal (RAMCLR) to the BFRAM 49 for clearing the memory, i.e., for writing all 0's into every address location of the memory to initialize the memory cycle. The RAMCLR input is derived from a micro-programmable RAM (MPR) 55. The μPR 55 comprises seven ECL 16k by 4 random access memories, such as seven model 10145 RAMS from Motorola. The RAMS are configured to hold 16 words each word being of 28 bits.

The input configuration logic 53 is shown in greater detail in FIG. 6 but, briefly, this logic circuit 53 configures the BFRAM 49 as a 64k×1 RAM when testing a 1 wide device, 16k×4 when testing a 4 wide device and 8k×8 when testing an 8 wide device. There are three input control lines 56 derived from the output of the μPR 55 that dictate which configuration corresponds to the device under test 13.

In the 1 wide mode, a composite error signal derived via line 57 from the pin electronics board 14 is used to generate a write enable signal on one of the eight write enable lines 51 inputed to the BFRAM 49. Which one of the eight output lines the write signal goes out on is determined by the status of the signals on three of the sixteen memory address lines 48 outputed from the address logic circuit 44, more particularly, the status of memory address lines (MA13, MA14, and MA15) at 58 and the 1 wide control signal derived from the µPR 55 over lines 56. In the 4 wide mode, four error signals derived over the eight error lines 54 from the pin electronics board 14, namely, E0 to E3 are multiplexed onto the output write lines 51 W0 to W3 and W4 to W7 depending on the state of memory address line MA and control signal on line 56. In the 8 wide mode, fail/error signals E0 to E7 are used to generate the write signals W0 to W7 in response to MA13, 14 and 15 signals on lines 58 and the 8 wide control signal on lines 56.

The data stored in the BFRAM 49 is read out via an output configuration logic circuit 59, shown in detail in FIG. 7. Briefly, the output configuration circuit 59 is controlled by the same control signals used to control the configuration of the input configuration logic circuit 53. Namely, outputs from the BFRAM 49 on eight output lines at 61 are multiplexed via the same memory address signals lines MA13–15 derived over input lines 58 from the memory address output lines 48 of the address logic circuit 44 and the control signals on line 56 from the µPR 55. The output configuration logic circuit 59 allows the eight data outputs from the BFRAM 49 to be multiplexed onto either one line or four lines or eight lines of the eight output lines 62 of the output logic circuit 59. In each case a composite error signal is also generated on output line 63. This composite error signal is designated BFAF. This signal is generated internally in logic circuit 59 by OR ing the valid fail signals on output lines 62 for the three different configurations depending upon which configuration is being utilized.

If a 1 wide configuration is selected by input control lines 56, and MA13, 14 or 15, then all eight outputs of the BFRAM 49 on line 61 are multiplexed onto the BFD0 output line of the eight output lines 62. The memory address inputs 58 are used as the multiplex control signals. If a 4 wide configuration is employed, then the eight outputs of the BFRAM 49 on line 61 are multiplexed onto four of the output lines namely, BFD0 to BFD3 using the 13th memory address line of address line 58 as the multiplex control signal. If an 8 wide configuration is employed then all eight outputs as derived from the BFRAM 49 are multiplexed onto BFD0 to BFD7 output lines 62.

The failure signals read out of the BFRAM 49 via the output configuration circuit 59 are read back through BFR readback AND gates 64 in response to read back signal RD6 derived from the output of the address decoder logic circuit 33 over one of the lines 37, namely the RD6 line. A suitable AND gate is a model 10197, commercially available from Motorola. When the output is read back from the gate 64 it is read out via an eight line output 65 which feeds into the eight line data bus 43 and thence via the bidirectional bus driver 41 to the main memory 17 of the CCU 16.

A total fails counter 66 is provided for counting the number of failures either directly from the memory device under test via the pin electronics board 14 and composite error line 57 or indirectly from the output of the BFRAM 49 via the output logic circuit 59 and composite error signal appearing on output line 63. A typical example of the counter 66 is four model 10136 counters commercially available from Motorola. The counter 66 can be initially loaded with a predetermined count as derived from the CCU 16 and its memory 17 via the data bus 43. Also, the counter 16 is under the control of the pattern generator 25 via the four input control lines 67. The µPR 55 provides one input, namely, enable totalizing (ENTOT) over line 68. The output of the counter 66 is derived over sixteen bit lines 69 and fed to a total read back gate 71 which, in response to input read signals RD0/RD1, derived from the output of the address and slot decoder logic 33 via line 37, reads the output of the counter 66 back to the data bus 43 and thence via the bidirectional bus driver 41 to the CCU 16. In a typical example, the gate 71 comprises a model 10197 commercially available from Motorola. The counter 66 also provides an overflow signal that is transmitted to a jump logic circuit 73 via output line 74. The jump logic circuit 73 is shown in greater detail in FIG. 5, but, briefly, produces a jump output signal to the pattern generator 25 over output line 80 in response to receipt of the overflow signal or when in receipt of a jump signal on one of four input lines 76 as controlled by 3 control inputs 75 connecting to the µPR 55, connected to post processing logic 77.

The jump output signal on the output line 80 is fed back to the programmable pattern generator 25 to cause the pattern generator 25 to terminate a particular sequence of addresses for scanning row or columns and to jump to the next sequence of addresses.

The µPR 55 includes a write enable input having four bits, namely, WR1* to WR4* at 76 which correspond to the first four output lines of the address and slot decode logic circuit 33 at 38. In addition, the µPR 55 includes eight input data lines corresponding to an extension of the data bus 43 for loading the program into the µPR 55 from the CCU 16 and its main memory 17. This program data is loaded into addresses selected from a µPR address register 81 in response to five address data bits 83, from the internal data bus 43 derived from the CCU 16. In addition, the address register is enabled by WR13 bit at 82 derived from the output 38 of the address and slot decode logic circuit 33. The address register which is a latch is reset by reset output 39 from the address and slot decode logic circuit 39.

The output of the µPR address register 81 includes three address bits on three lines 84 which are multiplexed into the address input terminal of the µPR via multiplexer 79 and its three output lines 77. The µPR address register 81 also outputs to the multiplexer 79 a control signal on line 85 which selects, when loading the µPR 55, the address data from the address register 81. A third output of the address register 81 at 86 is a non multiplexed address bit.

Once the program has been loaded from the CCU 16 into the µPR 55, the multiplexer 79 is switched in response to the multiplexer control singal at 85 to multiplex three bits of address data derived from the pattern generator 25 into the µPR 55 for selecting one of the programmed 28 bit words.

The output of the µPR 55 includes nineteen bits on nineteen output lines 87 which serve to control the operation of the post processing logic circuit 70. Another four bits, derived over output lines 52 and 56 go to control the BFRAM 49 and its input and output logic circuits 53 and 59. Another output on line 88 serves as an error mask enable signal which is fed to one input of an AND gate 89 for ANDing with the composite error signal derived from the output of output logic circuit 59. The output of AND gate 89 is inverted and thence ANDed with the composite error signal derived from the pin electronic board 14 and the device under test on line 57 to produce a fail output which is thence fed to the programmable pattern generator 25. Thus, the error mask enable output of the μPR 55 on line 88 serves to mask a detected failure such that the programmable pattern generator (PPG) 25 is rendered nonresponsive to such failure.

The μPR 55 is a high speed emitter couple logic ram array of 16 words by 28 bits per word. It is loaded by the CCU 16 as part of an initialization or set up mode. During the error capture and post processing modes of operation, it is addressed by 3 bits from the PPG 25 over lines 78. Thus, one block of 8 words can be addressed in real time by the PPG 25 and two such block can be preloaded. The 28 bits from each word (micro instructions) are used to control the various functions of the error capture and analysis system 31.

The post processing logic circuit 70 comprises a combination of counters, registers, comparators, rams and control logic that provides high speed analysis of the failure information stored in the BFRAM 49, all under PPG 25 control. This circuit in conjunction with control bits from the μPR 55 provides fast, algorithmic analysis capability without requiring CCU 16 intervention. The counters, register and control bits are all loaded by the CCU 16 before the analysis starts under PPG 25 control. The post processing logic circuit, is shown in greater detail in FIG. 8 but, briefly, there are 19 bits of information i.e., control signals fed into the post processing logic circuit 70 from the output of the μPR 55 over line 87. These inputs serve to set up the initial conditions for the counters, registers and so forth within the post processing circuit 70. Another 16 lines having 16 bits of information are inputed to the post processing logic circuit 70 over lines 48 from the address generation logic circuit 44. These addresses are employed for addressing certain of the counters, registers and the like within the post processing logic for setting up the initial conditions for the analysis. In addition, there are 5 bits of write data entered over line 93 of the write output line 38 of the address and slot decoder logic 33. These particular write bits comprise WR8 to WR12. Another 3 bits of information are entered over line 94 from the PPG 25, such input signals consisting of X∅=R Y∅=R and C2=R. These signals are for the purpose of clearing the counters within the post processing logic 70 when the scan through the particular row or column of the BFRAM 49 has been completed. The internal data bus 43 is also connected as an input to the post processing logic 70 for supplying 8 bits of data derived from the CCU 16 over the bidirectional bus driver 41. Another input comprises the composite error signal BFAF derived from the output of the output configuration logic circuit 59 over line 63.

One output of the post processing logic circuit 70 comprises 4 bits of data supplied over 4 output lines 76 to the jump logic circuit 73. The post processing logic circuit 70 includes a row mask ram and a column mask ram which stores the addresses of rows and columns which are masked for replacement. The output of each of the row and column mask rams is fed via output lines 96 and 97 to a mask ram readback gate 98 which serves to read out the row and column mask data onto the internal data bus 43 as data bits DB∅* and DB1* in response to a read signal RD7 derived from the address slot decoder logic circuit 33 via one of the lines 37. A suitable gate 98 is a model 10197 commercially available from Motorola.

Referring now to FIG. 3 the address and slot decoder logic circuit 33 is shown in greater detail. The circuit includes a comparator 101 and a demultiplexer 102. In a typical example, the comparator 101 comprises a model 74LS266 commercially available from Texas Instruments and the demultiplexers commercially available from Motorola. The comparator 101 receives at its address input seven of the address data lines, namely, address A4–A10 from the back plane bus 18 at 103. These address signals are compared with a slot identification code coded into 8 pins at 104. A back plane enable signal bit is fed in via input line 105 and if the slot code corresponds to the address code on line 103 and the back plane enable signal (BPEN) is present on 105 a select output at 106 is fed to the select input of the 1 to 16 bit demultiplexer 102. Address data derived over data line 34 from the back plane bus 18 is fed into the address input terminal 107 of the 1 to 16 demultiplexer 102. Also, 3 bits of data supplied over 3 data lines from the CCU 16 are entered at input terminal 108. These control inputs at 108 comprise the bus write (BUSWR) data strobe (DSTB) and system clear (SYSCLR) control signals from the CCU 16. The demultiplexer 102, in response to the control and address inputs, demultiplexes the address signals onto one of three output lines 37, 38, and 39 corresponding to the outputs previously described with regard to FIG. 2.

Referring now to FIG. 4 there is shown in greater detail the address generation logic circuit 44 of FIG. 2. The address generation logic circuit 44 includes an inverter 109 for inverting the 16 memory address bits received from the PPG 25 over input line 46. In a typical example, inverter 109 comprises a model 10195 inverter commercially available from Motorola. Eight of the 16 input lines 46 contain the row address data bits X∅–X7 and the other 8 input lines comprise the Y address data bits Y∅–Y7. The X invert input control signal (XINV) and the Y invert signal (YINV) are received over two of the lines in the set 47 coming from the PPG 25. The inverter 109 inverts either the X or Y or both sets of addresses in accordance with the control signal from the PPG 25. The output of the inverter is fed to a mask 111 which masks any one or more of the 16 address input lines in accordance with addresses not being utilized in the BFRAM 49. The mask data is fed into the mask 111 via a mask latch 112 via a set of 12 input lines 113 having the 12 mask bits thereon. The mask latch comprises, for example, a model 10186 latch commercially available friom Motorola and the data which is latched therein comprises data DB∅* to DB7* entered over the eight internal bus lines 43 from the CCU 16. The data is written into the latch 112 under the control of a pair of write signals WR14 and WR15 derived over the write lines 45 from the output of the address and slot decoder logic circuit 33. Those address signals from the PPG 25 which are not masked are fed through the mask 111 to a series connection of a pair of latches 114 and 115 which serve a pipelining function to delay the address data from the PPG 25 so that it will match the address data that the device under test 13 receives from the PPG 25 and PEB 14. The data is clocked through the latches 114 and 115 by means of the clock signal (BCTCK2) received over one of the lines 47 from the PPG 25. Suitable pipelining latches 114 and 115 comprise model 10186 latches commercially available from Motorola.

The output of the pipelining latches 114 and 115 is fed to the input of counter 116 which is normally transparent to the output address signals derived from the PPG 25. The counter enable control signal is derived from a control register 274 over 275 and the counter clock signal is derived from clock generator 271 over 272. the clock generator 271 is shown in FIG. 20. In the counter transparent mode, the addresses from the PPG 25 are thence fed via sixteen lines 117 to the input of an address transform ram 118, such as four model 7072 1K ECL rams commercially available from Fujitsu of Santa Clara. The address transform ram 118, when enabled, allows the addresses to be reconfigured so that the address as stored is different than that actually on the device under test. When address transform RAM is performing its transform function, the addresses are written into the RAM 118 by means of a data load control signal on a set of input lines 119 consisting of the eight lines of the internal data bus 43 and two write lines WR6* and WR7* derived from the address slot decoder logic circuit 33 over output lines 38. The output of the address transform ram comprises the sixteen output lines with sixteen memory address bits thereon at 48.

Address generator logic circuit 44 is operable in two modes. In a first mode, as just described, the addresses as received from the PPG 25 are masked and delayed and fed to the output lines 48. In a second mode, the counter 116 is enabled by means of the counter enable control signal on line 275 and addresses are then generated by the counter 116 by means of a clock input (ADCK) from the clock generator 271 received over input lines 272.

Referring now to FIG. 5 the jump logic circuit 73 is shown in greater detail. The jump logic circuit 73 comprises an 8 to 1 multiplexer 121, such as a model 10164 commercially available from Motorola. The multiplexer 121 is controlled by the 3 bits of jump control data derived from the μPR 55 over input line 75. The signals which are multiplexed to the output line 80 in response to the jump select signals on line 75 comprise the overflow signal on line 74 and the three data bits derived from the output of the post processing logic circuit 70 over output lines 76. These 3 output data bits from the post processing logic circuits 70 correspond to XREG∅, YREG∅ and XYREG∅. These signals are generated when the spare rows, spare columns, and spare rows and columns are used up, respectively, as more fully described below.

Referring now to FIG. 6 the input logic configuration circuit 53 is shown in greater detail. The eight error input signals ER∅-ER7 come into the logic circuit 53 on the eight input lines 54. These error signals are derived from the pin electronic board (PEB) 14. The lines are separated into two sets of four bits each. The input signals E∅-E3 are applied to the input of a multiple AND gate integrated circuit 122, whereas the other four error signals E4-E7 are applied to the input of a second multiple AND gate 123. Error signals E∅-E3 are also coupled in parallel into the input terminals of a third multiple AND gate 124. In the AND gates 122 and 124 the respective error inputs E∅-E3 are ANDed with 4 wide and 8 wide control signals 4W and 8W derived from the output of the μPR 55 over lines 56. The 4 wide input error signals E∅-E3 may be written out onto output write lines W∅-W3 and W4-W7 depending upon the state of memory address signal MA13 on one of the memory address lines 58. The memory address signal MA13 is fed to one input of a pair of AND gates 125 and 126 for ANDing with a write enable pulse derived from the output of a flip-flop 127 which write enable pulse is generated in response to a clock input signal (BCTCK2) and a store input signal (STORE). The clock input is derived from the pattern generator as (BCTCK2) over one of lines 94 and the store signal is derived via line 56 from the output of the μPR 55. These clock and store signals are ANDed in AND gate 128 and fed to the clock input terminal of the flip flop 127 to produce the write enable signal.

One of the memory address signals MA13 to be ANDed in AND gate 126 is inverted via inverter 129 such that the outputs of gates 125 and 126 are of opposite sign. These outputs of gates 125 and 126 are then ANDed in respective gates 131 and 132 with the four wide control signal 4W to produce mutually exclusive outputs on lines 133 and 134. These outputs are then ANDed in AND gates 122 and 124 with the 4 wide error signals E∅-E3 to produce two sets of outputs on two sets of four output lines which are thence fed to the input terminals of a pair of OR gates 135 and 136 to appear as outputs W∅-W3 or W4-W7 on line 51, depending upon whether the mutually exclusive 4 wide control signals on lines 133 and 134 are set high-low or low-high.

For an 8 wide configuration, the 8 wide control signal 8W on one of lines 56 is ANDed in AND gate 137 with the write enable output of the flip flop 127 to produce a pair of outputs on line 139 and 133, one of which is buffer amplified via buffer amplifier 138. The output of buffer amplifier 138 is fed onto control line 133, whereas the other output of AND gate 137 is fed onto control line 139. The signals on lines 139 and 133 are of the same sign either high or low and are ANDed in AND gates 122 and 123, respectively, with error signals E∅-E3 and E4-E7, respectively, to produce two sets of outputs which are fed to the input of OR gates 135 and 136, respectively, to produce write enable outputs WR∅-WR3 and WR4-WR7 on the eight output lines 51.

In the case of a 1 wide configuration, the composite error signal derived from the PEB 14 over the composite error line 57 is fed via an inverter 141 to the data input of the write enable flip flop 127. It is strobed therethrough in response to the strobe and clock signals to one input of an AND gate 142 for ANDing with the 1 wide control signal 1W derived from the μPR 55 via one of the lines 56. The output of AND gate 142 is inverted and fed to one input of a multiplexer 143 for being multiplexed out on W∅ output line 51 via OR gate 135.

In a second mode of operation, the input configuration logic circuit 53 serves to clear the BFRAM 49 by writing 0s into all of its address locations. In this clearing mode, the ram clear signal (RAMCLR) on line 52 of the μPR 55 is applied to one input of an AND gate 144 for ANDing with a clear strobe signal (CLRSTB) derived form the clock generator 271 over line 273. The output of the AND gate 144 consists of control signals applied to the control input of OR gates 135 and 136 so that all 0s will appear on write outputs W∅-W7 as the multiplexer 143, in response to the memory address signals MA13, MA14, and MA15 on lines 58, run through the addresses.

Referring now to FIG. 7 there is shown, in greater detail, the output configuration logic circuit 59 of FIG.

2. The eight output lines 61 from the BFRAM 49 (B0∅–B07) are fed to the input of a pair of buffer amplifiers 151 for converting from the TTL logic of the BFRAM 49 to the ECL logic of the remainder of the circuitry. Suitable buffer converters comprise model 10124 buffers commercially available from Motorola. The eight output lines from the buffer amplifiers 151 are thence fed to the eight inputs of a 2 to 1 multiplexer 152 such as a model 10173 commercially available from Motorola, for multiplexing onto four output lines which are thence fed to the input of a 4 to 1 multiplexer 153. A suitable example of a 4 to 1 multiplexer 153 is a model 10174 commercially available from Motorola. The output of the second multiplexer 153 is the BFD∅ output on one of the eight output lines 62.

When the configuration of the BFRAM 49 is 1 wide, multiplexers 152 and 153 are enabled in response to the three address inputs signals MA13, MA14, and MA15 derived over lines 58 and the 1W control signal. The address signals are first fed through an inverter 154 and then the inverted outputs are applied to two pairs of OR gates 155, 156, 157, and 158. In OR gate 155, the 1 wide control signal 1W and the 8 wide control signal 8W are ORed with MA13* to derive a steady state signal which is not responsive to a change in state of MA13*. The 8 wide control signal 8W and the 4 wide control signal 4W are ORed in a second OR gate 156 with MA15* derived from the inverter 154 to derive a steady state signal which is responsive to a change in state of MA15 to produce an enabling output to the multiplexer 152. The 4 wide and 8 wide control singals 4W and 8W derived over lines 56 from the µPR 55 are ORed in a third OR gate 156 with MA14* to derive a steady state output signal which is responsive to a change in state of MA14 to enable the second multiplexer 153. Thus, when the 1 wide signal 1W is high and the memory address inputs MA13, 14, 15 go high on lines 58, OR gates 156, 157 and 158 are enabling for multiplexers 152 and 153 for multiplexing the outputs on lines 61 onto the first output data line BFD∅.

In the 4 wide configuration control signal 4W is high, 1W and 8W are low and MA13 is used to enable the first multiplexer 152 via OR gate 155 for multiplexing the first four output data bits B0519 –B03 from BFRAM 49 through to data lines BFD∅–BFD3, or bits B04–B07 from BFRAM 49 through to data lines BFD∅–BFD3 depending upon the enabling of multiplexer 152. In the 8 wide configuration no MA signal is sued and all of the OR gates 155, 156, 157 and 158 are set for disabling multiplexers 152 and 153 such that the eight inputs BD∅–BFD7.

In the 1 wide configuration the fail output signal on BFD∅ passes through AND gate 161 to the composite output line 63 called BFAF. The 4 wide outputs appearing on the first four output lines 62 and comprising BFD∅, BFD1, BFD2, and BFD3 are ANDed in AND gate 161 with the 4 wide control signal 4W fed to the AND gate 161 via an AND gate 162 which holds unused lines BFD1–BFD3 low when in the 1W configuration and when in the 4W configuration produces a composite fail signal on output line 63. The 8 wide control signal 8W, when low holds unused lines in the 1W and 4W configurations low and in the 8W configuration enables AND gate 161 to BFD1–BFD3 and enables AND gate 163 to BFD4–BFD7 to produce one half of the composite error signal on output line 63. The first half of the output signals on line 63 are produced by ORing of the first four data bits BFD∅–BFD3 at the output of the first AND gate 161. The OR function is produced by tying the outputs of AND gates 161 and 162 together. Suitable AND gates 161 and 162 comprise model 10104 gates commercially available from Motorola.

Referring now to FIG. 8 there is shown in greater detail the post processing logic circuit 70. The BFAF composite error signal received over line 63 is fed to one input of an AND gate 165 and strobed into a second AND gate 166 in response to a counter strobe signal (CTRSTB) received on input line 273 from the clock generator 271. In the second AND gate 166, the strobed BFAF signal is ANDed with a pair of mask signals (YMSK and XMSK) on lines 168 and 169 derived from the output of respective column and row mask RAMS 171 and 172. The column and row masks RAMS 171 and 172 serve to store the addresses of the rows and columns that have been flagged for replacement such that the mask signals work such that failure or error signals from columns and rows of the BFRAM 49 to be repaired are not counted or processed in the post processing logic circuit 70.

The mask output signals of the respective RAMS are enabled by passing the output of the respective mask 275 and 276 into one input of a respective AND gate 173 and 174 for ANDing with mask enable signals (YMSKENB and XMSKENB) derived from the µPR 55 over input lines 87. The output of AND gate 166 is gated fail signal (GFAIL) which is thence fed to the input of a counter source multiplexer 175. The fail input to the multiplexer 175 is multiplexed onto one or the other of a pair of output lines 176 and 177 in accordance with a pair of control signals (CTRSCR1/2) derived from the µPR 55 over a pair of lines 178 of the set of 19 lines 87.

When the first scanning pass is being made through the BFRAM 49 the GFAIL signals are multiplexed onto output lines 177 and fed to the count input terminal of an 8 bit column counter 179, such as two model 10136 counters commercially available from Motorola for counting the failures per row being scanned. The count control or select input of counter 179 is connected to the output of a counter clear logic 181 via a pair of lines 182. The counter clear logic circuit 181 is shown in greater detail in FIG. 9 but, briefly, includes 6 input lines 183 derived from the output of the µPR 55 over which six control signals (XCTRL/2, YCTRL/2 and S1/2) are recieved. In addition, a set of 3 input lines 94 are received from the PPG 25 for entering certain control signals (X∅=R, Y∅=R, C2=R).

In addition, the counter clear load logic circuit 181 includes a pair of input signals WR8 and WR10 which are write enable signals derived over lines 38 from the output of the address and slot decoder logic circuit 33. These signals are for resetting the counters to zero.

The output of counter 179 includes a set of eight output lines 184 fed to one input of a comparator 185 for comparison with the output count of an 8 bit column or Y register 186 such output being derived over an output line 187 consisting of eight lines. In a typical example the column register circuit 186 comprises a pair of model 10136 counters commercially available from Motorola.

The input to register 186 includes a pair of lines 188 for receiving from the µPR 55 a pair of input signals for instructing the register either to increment, decrement, preset or hold. The spare column initial value is written into the register 186 from CCU 16 via internal data bus 43. Both the column counter 179 and register 186 are coupled to the internal data bus 43 for writing initial count data into the respective counter and register. A third input to the Y register is a Y register clock signal derived from the output of Y register clock logic circuit 189 which is enabled by a write signal WR9 derived from the output of address and slot decoder logic circuit 33 over one of write lines 38. Depending upon the control signals on input lines 188 the Y register 186 will either hold, preset, decrement, or increment in response to a clock output signal derived from the clock logic circuit 189 over input line 191.

The comparator 185 compares the count of the number of failures per row from the output of counter 179 with the count of the number of spare columns from register 186 and when the number of failures per row exceeds the number of spare columns an output signal (C>R) is produced from comparator 185 on output line 192 which is fed to one input of a multiplexer 193. A suitable comparator 185 is a model 10166 commercially available from Motorola. A suitable multiplexer 193 is a model 10174 commercially available from Motorola.

In the first pass through the BFRAM 49 the multiplexer 193 is set to multiplex the output signal (C>R) on line 192 to output line 194. The selection of which of the input lines is to be multiplexed to the output line 194 is made by means of 2 bits of select data derived over select lines 87 from the output of the μPR 55 and consists of two signals (XMR1/2). The C>R signal is multiplexed to the input of an AND gate 195 and strobed therethrough in response to a clock pulse (CTRSTB) fed to the clock input line 196 of AND gate 195 via the intermediary of a delay 197. The clock signal (CTRSTB) is derived from the clock generator over lines 273.

The output pulse C>R signal from AND gate 195 is fed via line 198 as XREGCT* to the write enable input terminal of the X or row mask RAM 172 for writing (flagging) into the row mask ram 172 the address of the row to be replaced. The address is written into the row mask RAM 172 from a latch 199 which has latched therein the memory address data bits MAØ-MA7 derived over the first eight output lines 48 of the address generation logic circuit 44. The row mask is configured as a 256×1 bit RAM.

In addition to writing the address of the row to be masked, i.e., the flagged row, into the row mask 172 the output of AND gate 195 also supplies a pulse (XREGCT*) over line 198 to an X or row register clock logic circuit 201 to produce an output pulse which is thence fed via output line 200 to the input of an X or row register circuit 202 for decrementing the count in the register 202 by one as controlled by control signal (XREG1/2) on line 87. The register 202 has initially been loaded with a count corresponding to the number of spare rows, i.e., the number of rows available for replacement for repair of the memory device under test 13. The row or X register 202 includes two input control bits from the μPR 55 supplied via a pair of the 19 output lines 87. In addition, the X register 202 has an input coupled to the internal data bus 43 for writing data bits DBØ*-7* into the register 202 for initialing the count therein. The register 202 includes a set of 8 output lines 203 for reading the count on the register 202 out to one input of a comparator 204, of the same type as comparator 185, for comparison with the output of a row or X counter 205 which serves to count the number of failures per column of the scanned BFRAM 49 failure data. When the counter 205 is counting the failures per column the counter source multiplexer 175 is controlled by the input bits (CTRSCR1/2) on input line 178 from the μPR 55 so as to output the gated fail data (GFAIL) onto output line 176 as a count signal (XCTRCK) which is then fed into the count input terminal of the counter 205.

When the counter 205 has reached the end of a column the PPG 25 sends a signal to the counter clear logic circuit 181 which then sends a clear control signal over input lines 206 to the clear input terminal or control terminal of the counter 205.

The output count of the counter 205 is transmitted via 8 lines 207 to one of the inputs of the comparator 204 for comparison with the count of the register 202. When the count in counter 205 exceeds the count in register 202 an output signal C>R is obtained on output line 200 of the comparator 204 which is fed to one input of a Y multiplexer 213 of the same type as the X multiplex 193. In response to a select control signal (YMR1/2) from the μPR 55, the output signal (C>R) is multiplexed to one input of an AND gate 214 for being strobed via a delayed clock signal (CTRSTB) derived from delay 197 over line 196. The output of AND gate 214 comprises a signal (YREGCT*) which is fed via line 215 to the write enable input of the column or Y mask RAM 171 and to the input of Y register clock logic circuit 189.

In the column mask RAM, the signal (YREGCT*) serves to write into the RAM 171 the address of the columns flagged for replacement as stored in latch 216 as supplied thereto via the second eight memory address lines 48 from the output of the address logic circuit 44.

In the Y register clock logic circuit, the signal (YREGCT*) on line 215 and as enabled by WR9 on line 38 produces a clock output signal on line 191 for decrementing the count of the column (Y) register 186 by one count.

The X register 202 also includes an output signal at 208 which is high when the X register count is zero, meaning that there are no more spare rows. This signal (XREGØ) is fed back to one input of the X register clock logic circuit 201 to inhibit any further counting and it is also fed via line 208 to one input of an AND gate 209 for ANDing with an output signal (YREG≠0) derived from the output of the column or Y register counter 186 on line 211 when the count there is not yet zero. The Y register or column counter 186 also includes an output signal (YREGØ) on line 212 when the Y register count is zero. This output signal on (YREGØ) on line 212 is also similarly fed back to one of the Y register clock logic 189 to inhibit further counting.

The XREGØ 208 signal and the YREGØ 212 signal are ANDed in AND gate 277 to produce output signal (XYREGØ) on line 278 which goes to the jump logic.

Another output of the row or X register 202 is an output signal (XREG≠Ø) which is a high when the count therein has not been decremented to zero. This signal (XREG≠Ø) on line 221 is fed to one input of an AND gate 222 for ANDing with the (GFAIL) signal. The output of AND gate 222 is fed to one input terminal of the X multiplexer 193.

Similarly, the GFAIL signal is ANDed in AND gate 209 with the signals (XREGØ and YREG≠Ø) to produce an output fed to one input of the Y multiplexer 213 for multiplexing into AND gate 214 when the select signal (YMR1/2) from the μPR 55 is set for that selection. The outputs from AND gates 222 and 209 are selected for multiplexing for decrementing and masking when the post processing logic circuit 70 is performing a third scan of the BFRAM 49 fail data row-by-row to detect single bit failures and to flag such failures for replacement first by spare rows and then by spare columns.

Enable OR gates 279 and 280 are responsive to signals (XREG∅, YREG∅, YMDO, and XMDO) for disabling respective X and Y multiplexers after spare rows and/or spare columns have been used to prevent further counting of the failures in rows or columns. The disabling outputs of enable OR gates 279 and 280 are fed to respective multiplexers 213 and 193 over lines 224 and 225. In addition, the enable OR gates are responsive to a signal (STOREMSK*) from the μPR 55 to inhibit both multiplexers 193 and 213 during initialization of the various circuits, such as counters and registers.

Figure 9:
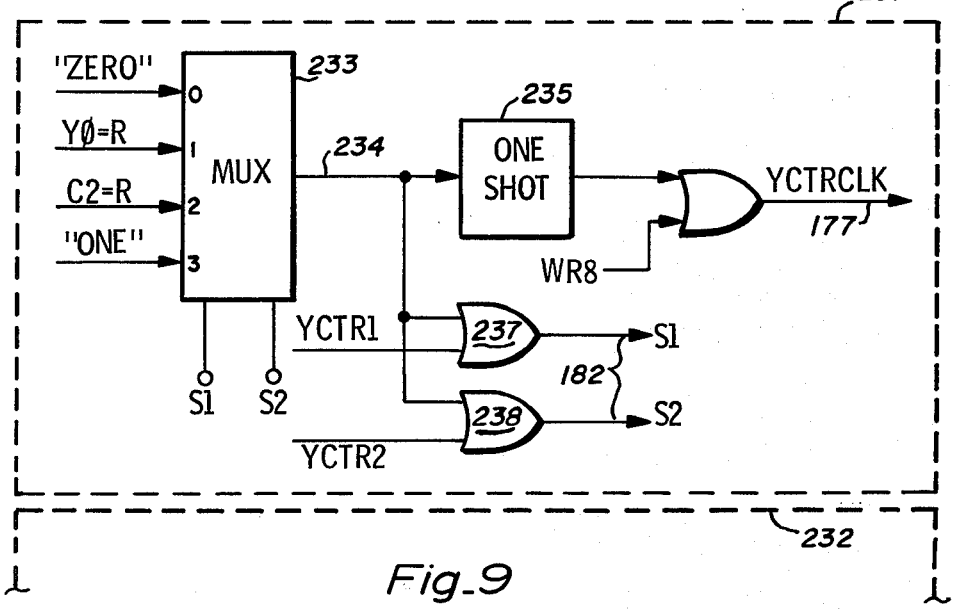
FIG. 9 is a schematic circuit diagram of the counter clear (load) logic circuit portion of FIG. 8 delineated by line 9—9 thereof.

Referring now to FIG. 9 the counter clear (load) logic circuit 181 is shown in greater detail. The circuit 181 includes two similar halves 231 and 232, half 231 serving to control, load and clear the Y or column counter 179 and half 232 serving to control, load and clear the X or row counter 205.

In circuit half 231 the signals (Y=R and C2=R) from the PPG 25 are inputed to a multiplexer 233. Two other input signals (zero and one) are generated by an open circuit and grounded circuit terminal, respectively of the multiplexer 233. A pair of select control signals (S1 and S2) derived from the μPR 55 over a pair of the nineteen output lines 87 select which one of the input signals is multiplexed onto an output line 234. The output of multiplexer 233 is fed to the input of a ONE-SHOT 235 for generating a pulse which is fed to one input of an OR gate 236 for ORing with write signal (WR8) derived from the output of address decoder logic circuit 33 to produce an output pulse signal (YCTRCLK) fed via line 177 to the column or Y counter 179.

Also, the output of multiplexer 233 on line 234 is fed to one input terminal each of a pair of OR gates 237 and 238 for ORing with respective steady state control signals (YCTR1 and YCTR2) derived from the μPR 55 over a pair of the output lines 87. The output signals (S1 and S2) of OR gates 237 and 238 are fed to the two bit input control terminals of the Y counter 179 via lines 182. These signals (S1 and S2) set the counter 179 for one of four modes of operation, namely, (1) preset, (2) increment, (3) decrement, or (4) hold.

In operation of the counter clear logic circuit 181, when the select inputs (S1 and S2) on lines 87 to the multiplexer are of such a state to select signal (zero), this gives a low on output 234 which inhibits presetting of the counter. When select inputs S1 and S2 are such as to select signal (Y=R), which is a high signal from the PPG 25 indicating an end of a row, a pulse (YCTRLK) output is produced and OR gates 237 and 238 produce outputs to set the counter to the preset mode such that receipt of the YCTRCLK pulse resets the counter 179 to zero. When the select input signals (S1 and S2) are such as to select the (ONE) input for multiplexing, the output of multiplexer 234 goes high which generates a preset control signal to the counter 179 as output signals (S1 and S2) 182 and generates an automatic reset clock signal (YCTRCLK) on 177 which results in presetting the counter to zero. When a jump signal is received by the PPG 25 during the scan of a row, the PPG 25 commands the μPR 25 to output word number one which is inputed to the multiplexer 234 as select signals S1 and S2 which select ONE for multiplexing to its output. This again results in presetting the counter 179 to zero as aforedescribed. Also, the counter 179 can be reset to zero by the CCU 16 sending a positive WR8 pulse into OR gate 236 when control signals (YCTR1 and YCTR2) from the μPR are both high to select the preset mode.

The second half 232 of the counter clear and load logic circuit 181 is essentially the same as half 231 except that it controls, clears, and loads the X or row counter 205 over lines 176 and 206. This circuit has the following signals interchanged: X=R for Y=R, XCTR1 for YCTR1, XCTR2 for YCTR2, WR10 for WR8, and XCTRCLK for YCTRCLK.

Figure 10:
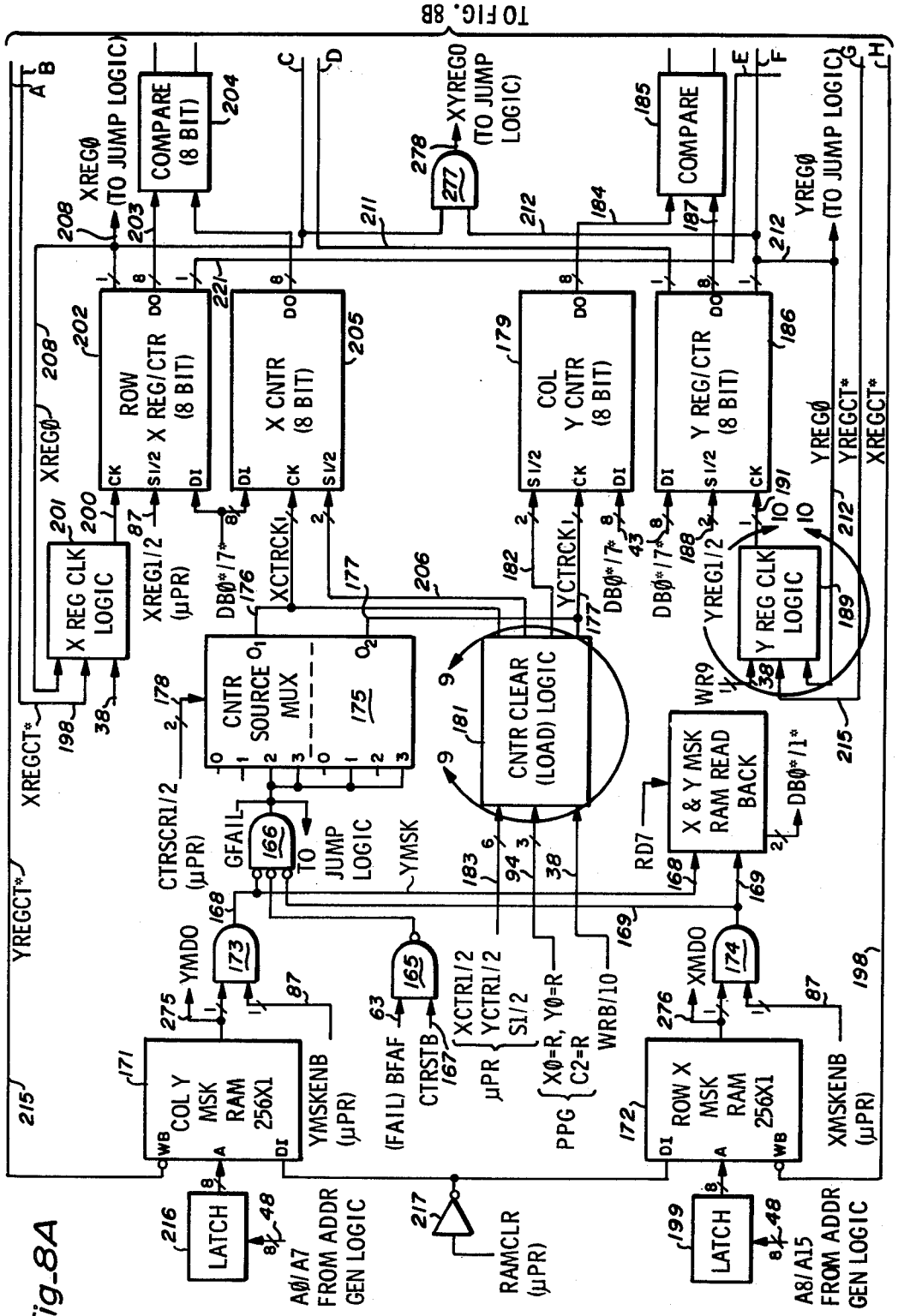
FIG. 10 is a schematic circuit diagram of the Y register clock logic circuit portion of FIG. 8 delineated by line 10—10 thereof.

Referring now to FIG. 10 there is shown in greater detail the circuitry for the Y register clock logic circuit 189. The input signals (YREGCT* and YREG∅) are applied to the inverting input terminals of AND gate 241 for ANDing therein. The output of AND gate 241 is fed to one input of an OR gate 242 for ORing with write enable signal (WR9) from the CCU 16 via address decoder logic circuit 33.

In operation, the signal (YREG∅) is a steady state signal and when it is high this blocks the Y register count signal (YREGCT*) so that counter 186 will not increment or decrement. During operation of the post test processing for repairability analysis, the write enable signal (WR9) is a steady state low which allows the other input signal (YREGCT*) to pass through OR gate 242 to the register 186 for decrementing same. When the write enable signal (WR9) from the CCU 16 is high (a positive pulse), the CCU 16 is writing into the register 186 through OR gate 242, since at that time (YREGCT* and YREG∅) are steady high so the output of AND gate 241 is a steady low.

The X register clock logic circuit 201 is essentially the same as circuit 189 with the exception that the following signals are substituted as follows: (XREGCT*) for (YREGCT*), (XREG∅) for (YREG∅) and (WR11) for (WR9).

In operation of the error capture and analysis system 31 with particular emphasis on the post processing logic circuit portion 70, three passes through the BFRAM 49 data are performed. These passes are under the control of four 28 bit words stored in the μPR 55 and each word is selected in accordance with the program of the CCU 16 under control of the PPG 25.

In the first pass, the BFRAM 49 fail data is scanned row-by-row. The failures per row are counted and if the failures per row exceed the number of spare columns, that row is flagged for replacement. If upon flagging any row for replacement all the spare rows are used up anywhere in the first pass, jump to the second pass. If the spare rows are not used up in the first pass, when the row-by-row scan is completed, jump to the second pass.

In the second pass, the BFRAM 49 fail data is scanned column-by-column and the failures per column are counted, except that failures in any row previously flagged for replacement are not counted, i.e. masked. If the number of counted failures per column exceeds the number of spare rows remaining after the first pass, that column is flagged for replacement by a spare column and the number of spare columns is reduced by one for each such column flagged for replacement. If at any point in the second pass all the spare columns are used up, jump to the third pass. If there are remaining spare columns at the end of the second pass jump to the third pass.

In the third pass the BFRAM 49 fail data is scanned row-by-row and rows and columns previously flagged for replacement are masked so failures in flagged rows are not counted. The first single failure counted in any row is flagged for replacement by one of the spare rows if any, if none, for replacement by one of the spare columns, if any, and the number of remaining spare rows and columns are reduced by one for each such flagged replacement. If at any point in the third pass a failure is counted for which there is no remaining spare row or column for replacement the device under test is flagged as non-repairable.

Figure 11:
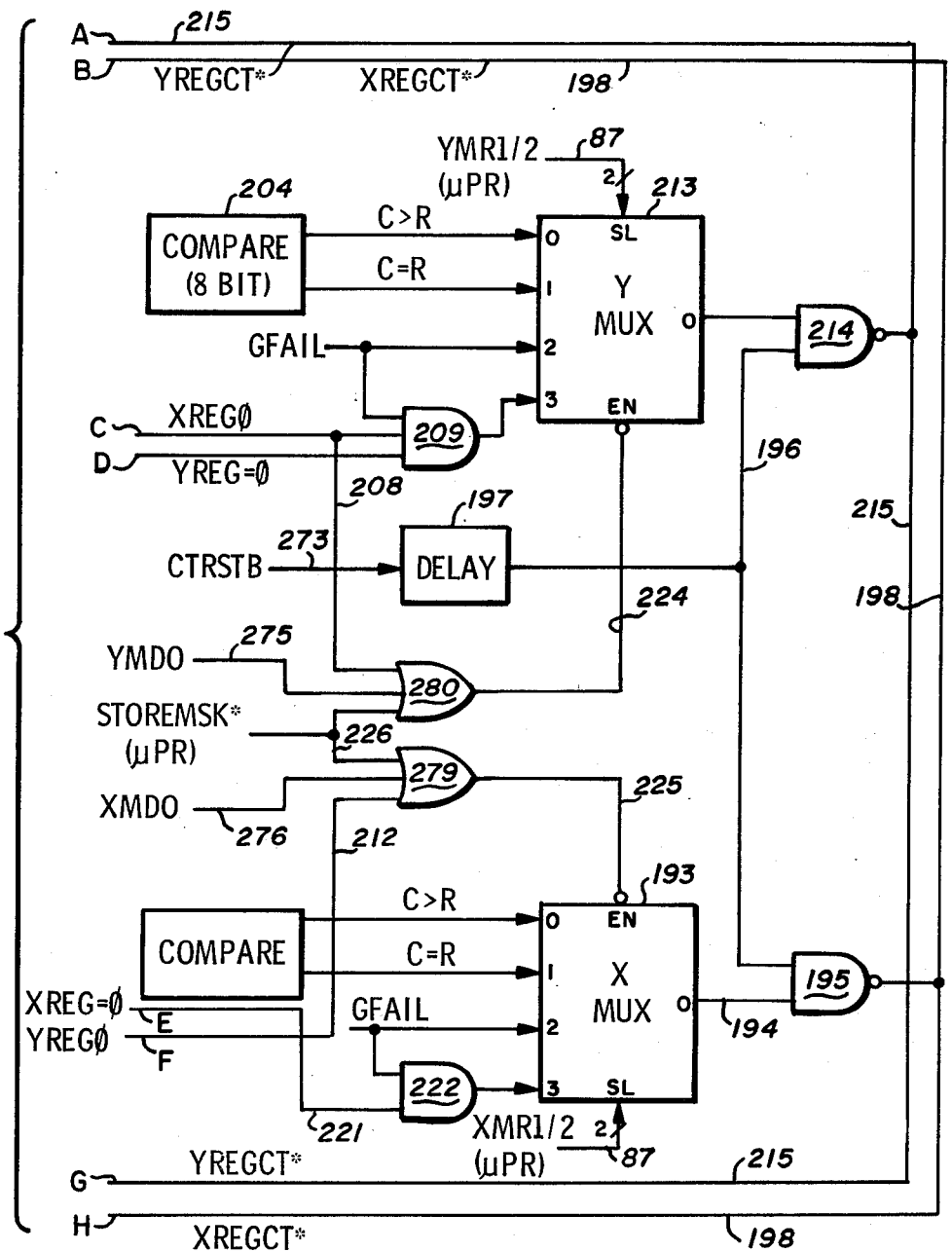
FIG. 11 is a series of four memory matrices A, B, C and D having faulty memory locations therein.

Referring now to FIG. 11 there are shown four example 8×8 bit memory arrays A, B, C and D, with failure elements designated by X's. The X address dimension, addresses rows 0-7 while the Y addresses columns 0-7. By looking at example A, it is readily apparent that if row 3 and column 2 were replaced, all failed bits could be repaired. However, if it were approached from the wrong axis, it might be concluded that it was required to replace rows 1, 3, 5, and 7 as well as columns 0, 1, 2, and 4. This example illustrates the basic principle involved in looking for repairability which is as follows: If scanning through the X addresses the number of failures exceeds the number of columns that can be replaced, try replacing the orthogonal axis instead, in this case Y3. In addition, on the first pass through the image array ignore single bit failures. This strategy will require a minimum of 3 passes through the BFRA 49 (image array) to determine if repairability is possible.

Figure 12:
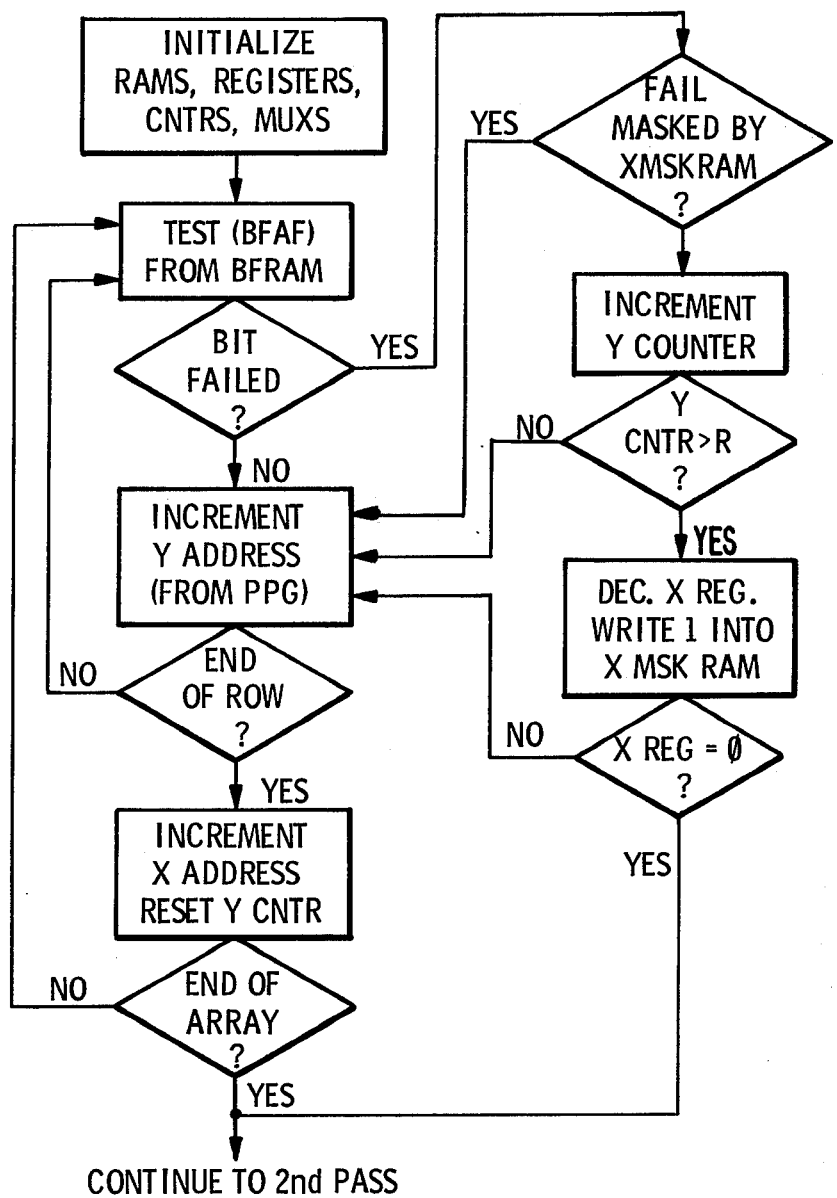
FIG. 12 is a logic flow chart of the first pass algorithm.

Using the foregoing strategy, a prose description of the algorithm used for testing repairability is as follows:

Use a Y fast scan through the array first, i.e. X0Y0, Y1X0, Y2X0, etc. If the number of failures encountered while scanning the array exceeds the number of columns that can be replaced, then replace that row and decrease by one the number of rows remaining that can be replaced. If the number of failures encountered in scanning a row does not exceed the number of columns that can be replaced, do nothing. Next increment the row addresses (X1), reset the Y counter 179 and repeat the Y fast scan through the second row performing the same functions as before. Continue the fast Y scan through the image array. If at any time the spare rows are all used up, jump to the second pass. For the example array A of FIG. 11, this would yield the following results: Failed bit X1, Y2 would be ignored; the failures at X3 and Y0-3 would be "repaired" by flagging for replacement row X3; failed bit X5, Y2 and X7, Y2 would be ignored. Thus, it would have "used up" one spare row and fixed 4 failed bits in the first trial pass through the image array. FIG. 12 is a program logic flow diagram of the first pass through the BFRA 49.

The algorithm would proceed by making a second pass through the image array using a fast X scan pattern, i. e. X0Y0, X1Y0, X2Y0 .... Again, it will perform the same functions as before except this time on the orthogonal axis. Proceeding through example A again, it would ignore failed bits X3, Y0 and X3, Y1. In checking column Y2 by incrementing the Y counter, it would exceed the number of rows that could be replaced and therefore, it would replace instead column Y2. The failed bit at X3Y3 would be ignored. The program logic flow diagram for the second pass is the same as that of FIG. 12 except that X is substituted for Y and Y is substituted for X in all blocks.

Now, using the information that it wants to replace row X3 and column Y2, it masks out the fails on that row and column and makes a 3rd pass through the array. It finds no more errors and therefore concludes that the array can be repaired by replacing a single row at X3 and a single column at Y2 (as indicated by the arrows). The third pass program logic flow diagram is shown in FIG. 21.

The second example B is somewhat more complicated, but assuming that two spare rows and two spare columns are available, the 1st pass would result in flagging for replacement rows 0 and 5 and the 2nd pass would replace column 1. The single bit failures at Y4, X4 would get fixed up on the third pass by flagging for replacement column 4 resulting in a repairable array. Example C shows 4 single bit failures that could be repaired and finally D shows an unrepairable array (assuming still 2 spare rows and 2 spare columns).

Referring now to FIG. 8, with the foregoing algorithm in mind, it is seen how the algorithm is implemented in hardware. X and Y registers 186 and 202 are used to store the number of spare rows and column initially available and decrement them as they are used. Next, X and Y counters 179 and 205 are used to keep track of the number of failures encountered in scanning a row or column. These counts are compared with the corresponding register and if C>R the opposite mask ram will be loaded with a one and the register decremented. In addition at the end of a row scan, the Y counter is reset before starting on the next row scan.

The multiplexer following the comparators allows selecting one of 4 possible conditions for writing into the mask rams and decrementing the registers. These various conditions are used for the different passes through the image array and allow great flexibility for considering different algorithms.

The μPR 55 is 28 bits wide and up to 8 words (microinstructions) deep under real time (PPG) control. These 28 bits are used to control the various functions of the error capture and analysis system 31 (ECAPS) with the majority used for the post processing logic 70. The functions of the 28 bits will be covered in detail 8 bits at a time as this is how they are loaded by the CCU 16. The first byte of the μPR 55 is shown below:

| 7 | 6 | 5 | 4 | 3 | 2 | 1 | 0 |
|---|---|---|---|---|---|---|---|
| CTRSCR | XMSK | X MUX SELECT | | Y REG CONTROL | | Y CTR CONTROL | |
| 1 | ENB | XMR2 | XMR1 | YREG2 | YREG1 | YCTR2 | YCTR1 |

BYTE 1 - μPR 55

All bits used to control the function of the counters or registers operate according to the logic table below:

| BIT 2 | BIT 1 | FUNCTION |
|---|---|---|
| 0 | 0 | HOLD-NOP |
| 0 | 1 | INCREMENT |
| 1 | 0 | DECREMENT |
| 1 | 1 | LOAD |

COUNTER SOURCE MUX. LOGIC TABLE

This logic table applies to the X and Y counters and registers and defines the operation of the first 4 bits of the μPR 55. The next two bits (XMR1 and XMR2) control the X multiplexer according to the following table:

| BIT 2 | BIT 1 | SELECT |
|---|---|---|
| 0 | 0 | CNTR > REG |
| 0 | 1 | CNTR = REG |
| 1 | 0 | GATED FAIL |
| 1 | 1 | MSK AND GATED FAIL |

X AND Y MULTIPLEXER LOGIC TABLE

The X mux controls decrementing the X register and loading the X mask ram (see FIG. 8).

Bit 6 is X mask enable (XMSKENB) and if at a one level it enables (allows) masking of fails by the X mask ram.

Bit 7 is counter source 1 (CTRSCR1) and is one of two bits used to control the counter source multiplexer 175. The second bit is bit 7 of byte 2 and is labled CTRSCR2. Together they operate as follows:

| BIT 2 | BIT 1 | SELECT |
|---|---|---|
| 0 | 0 | NO CLOCK |
| 0 | 1 | CLK TO X CNTR |
| 1 | 0 | CLK TO Y CNTR |
| 1 | 1 | CLK TO BOTH |

COUNTER SOURCE MUX. LOGIC TABLE

Byte 2 of the μPR is similar to byte 1 except it controls the orthogonal axis circuits:

| 7 | 6 | 5 | 4 | 3 | 2 | 1 | 0 |
|---|---|---|---|---|---|---|---|
| CTRSCR 2 | YMSK ENB | Y MUX SELECT | | X REG CONTROL | | X CTR CONTROL | |
| | | YMR2 | YMR1 | XREG2 | XREG1 | XCTR2 | XCTR1 |

BYTE 2 - μPR

The 3rd byte of the μPR is shown below:

| 7 | 6 | 5 | 4 | 3 | 2 | 1 | 0 |
|---|---|---|---|---|---|---|---|
| STORE | ERROR MASK ENABLE | RAM CLR | STORE MASK | BFRAM CONFIG. | | CNTR CLEAR MODE | |
| | | | | 8W | 4W | S2 | S1 |

BYTE 3 - μPR

Bits 0 and 1 labled S1 and S2 control a multiplexer 233 in the CNTR CLEAR LOGIC block. The mux outputs are or'ed into the X and Y counter control bits and are used to generate a 11 code (LOAD or CLEAR). The mux selection is as follows:

| S2 | S1 | CLEAR WHEN: |
|---|---|---|
| 0 | 0 | NEVER |
| 0 | 1 | X∅ = R or Y∅ = R |
| 1 | 0 | C2 = R |
| 1 | 1 | ALWAYS |

COUNTER CLEAR MUX SELECT

The equality signals above come from the PPG, not the ECAPS logic, and represent the "end of a row" (Y∅=R) or the "end of a column" (X∅=R) or loop counter C2 in the PPG reaching its register value.

Bits 2 and 3 of Byte 3 of the μPR control the configuration of the BFRA as follows:

| 8W | 4W | CONFIGURATION |
|---|---|---|
| 0 | 0 | 64K × 1 |
| 0 | 1 | 16K × 4 |
| 1 | 0 | 8K × 8 |
| 1 | 1 | NOT USED |

BIT FAIL RAM ARRAY CONFIGURATION

Bit 4 is the STORE MASK control bit. If it is a one, the X and Y muxs are enabled allowing storage in the respective mask rams. A zero inhibits writing into the mask rams.

Bit 5 entitled RAMCLK is the "data in" signal to the BFRAM and the X and Y mask rams. A one on this bit, together with an appropriate PPG pattern will clear all 3 rams simultaneously. Bit 6 is ERROR MASK ENABLE and a one for this bit will allow the BFRAM to mask errors to the PPG Bit 7, the STORE bit controls the write enable signal to the BFRAM through the configuration logic. A one on this bit allows errors to be written into the BFRAM; coversely, a zero blocks errors from being written into the BFRAM.

Byte 4 of the μPR is only ½ byte wide as follows:

| 7 | 2 | 1 | 0 |
|---|---|---|---|
| ENB TOTAL | JUMP CONTROL | | |
| | JC4 | JC2 | JC1 |

BYTE 4 - μPR

The 3 jump control bits control multiplexer 121 in the JUMP LOGIC block 73 (See FIGS. 2 and 5 according to the following:

| JC3 | JC2 | JC1 | JUMP CONDITIONS |
|---|---|---|---|
| 0 | 0 | 0 | NO JUMP |
| 0 | 0 | 1 | XY REG ∅ |
| 0 | 1 | 0 | Y REG ∅ |
| 0 | 1 | 1 | X REG ∅ TOTALIZER |
| 1 | 0 | 0 | OVERFLOW |
| 1 | 0 | 1 | NOT USED |
| 1 | 1 | 0 | NOT USED |
| 1 | 1 | 1 | NOT USED |

JUMP CONTROL LOGIC

The output of the jump control mux goes to the PPG and is labled EXT JMP (to PPG).

The last bit of the μPR—B3 of byte 4 is TOTALIZER ENABLE and a one on this bit allows the totalizer counter to count fails. FIG. 13 lists all 28 bits of the μPR for quick reference.

Specific coding examples will be used to illustrate how ECAPS 31 functions in conjunction with the PPG 25 to perform its job. The first example will be to CLEAR the BFRAM. This is accomplished by scanning through the BFRAM and writing a zero into each bit. This is accomplished by programming the RAM CLR bit of the μPR to a one and using a simple scan pattern in the PPG. Microinstruction ∅ of the μPR will be used to generate RAMCLR and referring to FIG. 13, write:

BFR ∅ μP ∅ ∅2∅∅∅∅∅ where BFR ∅ instructs the TSLANG complier to load block ∅ of the μPR with the following data. μP ∅ defines loading address ∅ of the μPR. The next 7 digits are HEXIDECIMAL representatives of the 28 bits of a μPR word. The 2 in HEX digit 6 is the RAMCLR bit while all other functions use the default value (∅). The PPG is now programmed to perform a sequencial scan through memory. An additional requirement from the PPG is to clear out all pipeline registers (set them to zero) and this requires one μ instruction in the PPG. Details on programming the PPG 25 are published in the PPG section of the sofrware manual for the model COLT memory tester 12 such manual being commercially available from Pacific Western Systems, Inc., of Mountain View, Calif. The flow chart for the sequencial scan pattern is shown in FIG. 14.

The flow chart of FIG. 14 when coded will yield the following program:

PPG 7 PM ∅ ∅4∅∅∅∅F∅F∅F∅∅∅
PPG 7 PM 1 ∅813∅∅222∅∅∅4∅
PPG 7 PM 2 ∅C25∅∅F∅F∅2∅∅4∅
PPG 7 PM 3 ∅∅∅F∅∅∅∅∅∅∅∅4∅
PPG 7 XR ∅ ∅∅FF∅∅
PPG 7 YR ∅ ∅∅1F∅∅
PPG 7 LR ∅ ∅∅∅∅∅∅3 where PPG Block 7 microinstructions are used for ECAPS routines (PPG7) and the X∅ register is programmed for 256 rows, the Y∅ register is programmed to 32 columns, and the C2 loop register is programmed to 3. NOTE: The CONFIGURATION is automatically programmed to be 8K×8 when the RAMCLR bit is two.

By adding a POWER SEQ statement and a RUN statement, programming is complete for the BFRA CLEAR routine. The complete coding is shown below with a LABEL and RETURN thus writing it as a subroutine that may be called by the main run program at any time.

LABEL CLRBFR

BFR ∅ μP ∅ ∅2∅∅∅∅
PPG 7 PM ∅ ∅4∅∅∅∅F∅F∅F∅∅∅
PPG 7 PM 1 ∅813 ∅∅222∅∅∅4∅
PPG 7 PM 2 ∅C25∅∅F∅F∅2∅∅4∅
PPG 7 PM 3 ∅∅∅F∅∅∅∅∅∅∅∅4∅
PPG 7 XR ∅ ∅∅FF∅∅
PPG 7 YR ∅ ∅∅1F∅∅
PPG 7 LR ∅ ∅∅∅∅∅∅3
POWER SEQ VREF ∅
RUN 7/∅ IF
RETURN

The final latch in the address generation logic that is used to address the BFRA transform rams is actually a counter and thus two modes of addressing are possible. The normally used mode is using addresses from the PPG; however, it is possible to increment the counters from ZERO and use this mode to load the transfer rams. Either method can be used, but for this example, we will use the counter increment mode rather than programming the PPG.

As is common in the entire COLT memory test system 12, the ECAPS PCB can be programmed directly by using MEM statements. FIG. 15 is the CONTROL MAP for the ECAPS PCB and defines all read and write signals for the board. The TSLANG MEM statement will generate the board slot code (F∅B) and the particular sub-address (∅-F) desired to either write into the board or read out of it. For example, MEM F∅B∅ ∅∅ would cause a write pulse on word ∅ (BOARD RESET) and would generate the reset function on the board.

The ECAPS address counters are incremented by setting the BFCNT (bit fail count) bit to a one and clocking the BFCK signal. The data bus on the board is inverting from the μP backplane bus and thus it is necessary to write the complement data to get the desired result. Thus to set the BFCNT bit to a one requires:

MEM F∅B5 FD where the complement of FD is ∅2, and to generate a BFCK requires:

MEM F∅BC ∅∅

This example will load a 1 to 1 transform; i.e. at address ∅ it will load data of ∅, at address 1, data of 1, etc. till finally at address 255 it will load data of 255. This data pattern is readily generated algorithmically using a FOR and MEM statement as follows:

FOR X=255 TO ∅ STEP−1
    MEM (sF∅B6)=X
NEXT X

This series of statements will generate the following commands to the ECAPS PCB:

MEM F∅B6 FF
MEM F∅B6 FE
MEM F∅B6 FD

MEM F∅B6 ∅∅

Again, note data is complemented.

To start at a known address, the pipeline register will be cleared with a RESET and this clear state is then loaded into the Xform ram address counters as follows:

MEM F∅B∅ ∅∅ (RESET)
MEM F∅B5 FF (BFCNT=LOAD)
MEM F∅BC ∅∅ (BFCK)

Now the code for the entire subroutine can be written as follows:

LABEL LDBFXFM
    MEM F∅B∅ ∅∅        ⎫
    MEM F∅B5 FF        ⎬   (INITIALIZE ADDRESS)
    MEM F∅BC ∅∅        ⎭
    MEM F∅B5 FC            (PROG TO INC-NO CHAIN)
    FOR X = 255 TO ∅ STEP-1
    MEM ($F∅B6)=X          (WRITE X XFORM)
    MEM ($F∅B7)=X          (WRITE Y XFORM)
    MEM F∅BC ∅∅            (INC ADDRESS)
    NEXT X                 (REPEAT LOOP)
    RETURN

An FC is used in the 4th statement instead of an FD in order to set the RDMSK bit high which allows the Y counter and X counter to count at the same time. Also note the two MEM write commands, statements 6 and 7, that write 1st into the X transform ram and then into the Y transform ram. FIG. 16 is a flow chart for the routine.

The following example shows the programming necessary to run (execute) a PPG pattern and capture errors in the BFRA. The TSLANG statement RUN ECAP is a high level statement that performs the following functions:
1. Runs the CLRBFR pattern to clear the BFRA and the X and Y mask rams.
2. Programs the appropriate bits in the ECAPS PCB to set it up for storing (capturing) errors.
3. Finally RUNS the specified pattern to capture the errors.

For example, the following command:
RUN ECAP CHKRBD
would generate the actual COLT statements shown below:

| | |
|---|---|
| MEM FØBD ØF | (LD μPR ADDR OF Ø) |
| MEM FØB3 DF | (SET RAM CLR BIT ACTIVE) |
| MEM FØB3 7F | (SET RAMCLR INACTIVE; STORE INACTIVE) |
| RUN Ø/ØIF | (EXECUTE CHDBD PATTERN) |

The foregoing assumes that the CLRBFR pattern is loaded into block 7, starting address Ø and that the checkerboard pattern is loaded into block Ø, starting address Ø of the PPG.

One of the features of ECAPS 31 is its ability to perform high speed algorithmic processing of the bit fail data. A detailed example of one possible processing algorithm is covered in this example. The general approach will be as follows:
1. Load the PPG pattern to be executed.
2. Load the ECAPS-μPR
3. Complete ECAPS programming.
4. Execute the post processing pattern.
5. Read out the results.

The post processing algorithm is described as follows:

PASS I. SETUP:

1.1 Preset the Y register to be equal to the number of spare rows.
1.2 Preset the X register to be equal to the number of spare columns.
1.3 Do not enable X or Y mask rams.
1.4 Program the Y counter to encrement on fails from the BFRA.
1.5 Enable the X mux and select C>R.
1.6 Program the X register to decrement.
1.7 Program the Y CNTR to reset (load) when YØ=R (from the PPG).

PASS 1 RUN:

1.1 Execute a Y fast scan pattern from PPG.
1.2 The Y counter will store fails and be cleared at YØ=R.
1.3 If the Y counter is greater than the Y register, store a "one" in the X mask ram and decrement the X register.
1.4 Continue till YØ=R and XØ=R (end of pass I) or the X register is zero and another failure occurs. Proceed to Pass II.

PASS II SETUP:

2.1 Program the X counter to increment on fails from the BFRA.
2.2 Enable the X mask ram output (mask fails from the BFRA to the X CNTR).
2.3 Enable the Y MUX and select C>R.
2.4 Program the Y register to decrement.
2.5 Program the X CNTR to reset (load) when XØ=R (from the PPG).

PASS II RUN:

2.1 Execute a X fast scan pattern from the PPG.
2.2 The X counter will store fails (except when masked by the X MSK ram) and be cleared at XØ=R.
2.3 If the X counter is greater than the X register, store a "one" in the Y mask ram and decrement the Y register.
2.4 Continue till XØ=R and YØ=R (end of Pass II) or the Y register is zero and another failure occurs. Proceed to Pass III.

PASS III SETUP:

3.1 Enable the X and Y mask ram outputs.
3.2 Enable the X mux and select FAIL and XREG≠Ø.
3.3 Enable the Y mux and select FAIL and XREG=Ø and Y REG≠Ø.
3.4 Program the X and Y registers to decrement.

PASS III RUN:

3.1 Execute a Y fast scan pattern from PPG.
3.2 The X Register will decrement for each unmasked fail until it equals zero. Also the X mask ram will store a one.
3.3 Additional failures after X REG=Ø will cause the Y REG to decrement and store a one in the Y mask ram.
3.4 Continue till YØ=R and XØ=R or X REG=Ø and Y REG=Ø and another failure occurs.
3.5 If the first condition occurs, halt. RAM REPAIRABLE.
3.6 If the second condition occurs, set the PPG flag and halt. RAM not REPAIRABLE.

In the PPG 25, which is a part of the COLT memory tester commercially available from Pacific Western Systems, Inc. of Mountain View, Calif., a micro-programmable RAM is included which is programmed in accordance with the program logic flow diagram of FIG. 17 for controlling various elements of the ECAPS system 31 to perform the memory repairability analysis. More particularly, in the diagram of FIG. 17, the right bottom corner of each instruction box includes a number which corresponds to the particular program memory address Ø-13 and 22 shown in the coding chart of FIG. 18 for the POG 25. In other words, the μ-programmable RAM of the PPG 25 is programmed with the micro instructions of FIG. 18 to carry out the program logic of FIG. 17.

Figure 18A:
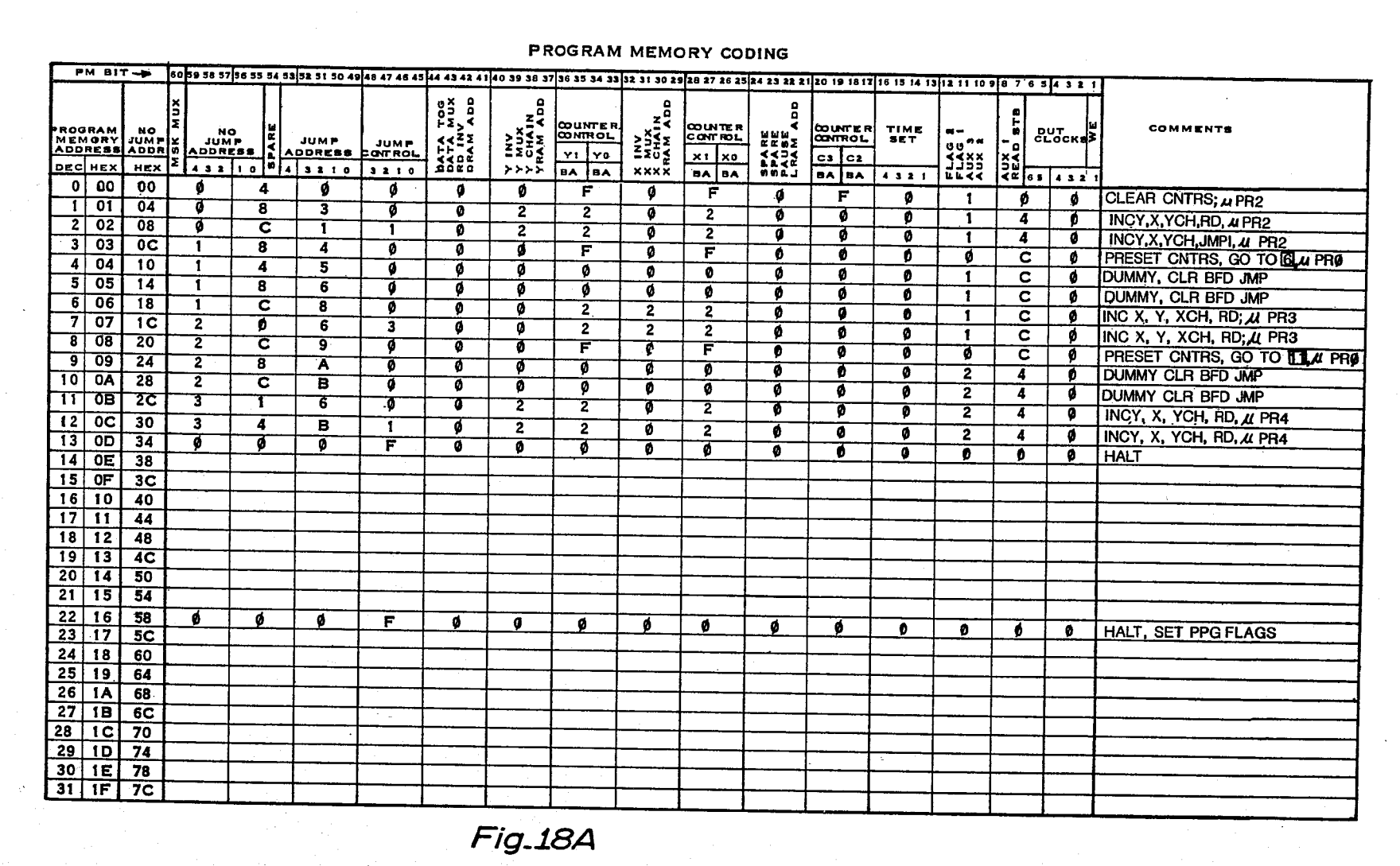

In accordance with the flow diagram of FIG. 17 and the detail program of FIG. 18, the PPG 25; (1) generates addresses at 46 for addressing the BFRAM 49 in the proper sequence; (2) generates control bits AUX1-/AUX3 at 78 for selecting the particular "word" (address) of the μPR 55 to be executed in performance of the post processing algorithm; (3) responds to an external jump signal 80 generated by the ECAPS system 31 to terminate any given pass; and (4) finally responds to the jump signal at 80 to set a flag to indicate that the memory under test 13 is non-repairable.

The three signals XØ=R, YØ=R and C2=R from the PPG25 at 94 (See FIG. 2) are not to be confused with C and R used in connection with signals within the post processing circuit 70 and in FIG. 8. These signals from the PPG 25 are standard signals used therein.

Y∅=R and X∅=R are signals indicating the end of a column or row, respectively, whereas C2=R is not used as yet. YINV, YINV, and BCTCK2 are three more PPG 25 output signals to the ECAPS system 31 at 47. YINV and YINV are signals indicating that the PPG 25 logic has inverted its internal X and Y addresses respectively, and these signals are fed into the ECAPS system 31 to invert the addresses therein to conform to the addresses inverted within the PPG 25. As to BCTCK2 this signal is merely a clock signal generated within and used within the PPG 25 and it is used in ECAPS 31 for synchronizing operation of ECAPS 31 with the operation of the PPG 25. ES* is an error strobe signal generated within the PPG 25 and is fed into clock generator 231 in ECAPS 31 for generating further clock signals to again synchronize operation of the PPG 25 with those of the ECAPS system 31.

The PPG 25 follows standard PPG programming with one important exception. When using the ECAPS system 31 an EXT JMP signal 80 is generated by the ECAPS hardware under certain conditions and the jump is ungated in the PPG and occurs unconditionally. Thus the flow chart of FIG. 17 must account for this jump and additionally, it takes 2 cycles of the PPG to allow the EXT JMP signal to clear out. As stated previously, the PPG selects the required instruction in the ECAPS-μPR via 3 aux bits. The flow chart identifies which μPR instruction is selected at each step of the flow.

In programming the μPR 55 of the ECAPS system 31, a μPR coding form is used (See FIG. 19). Consider first the instruction No. 2 used for PASS 1. The 1st hexidecimal digit controls the function of the Y counter and register. To increment the counter and do nothing to the register the binary code is ∅∅∅1, giving a hex digit of 1. The next hex digit includes the X MUX selection (XMR1,2), the X mask enable bit and the counter source selection bit 1. The following choices are used: to enable the X MUX and select C>R (∅∅), the X mask ram is not enabled (∅) and counter source selection is 1 giving a binary 1 in the 8 position resulting in a hex digit of 8. The next hex digit controls the X counter and register. To hold the counter and to decrement the register it takes a binary 1∅∅∅ or a hex digit of 8 again.

The next hex digit is the Y MUX selection, Y mask enable and counter source selection bit 2. All of these are ∅. The next hex digit is the counter clear condition (X∅=R or Y∅=R requires a binary ∅1), and the configuration, a binary ∅∅=64k by 1. Thus the hex digit is a 1. The next hex digit contains store mask (1), a ram clr (∅), err msk enb (∅), and the jump control (a binary ∅11 for jump on XREG=∅) and the enb tol bit (∅) giving a hex digit of 3. The programming for this microinstruction is:

BFR ∅ μP 2 311∅881

In a similar manner, the next microinstruction is coded. An 8 in the 1st digit will decrement the Y reg. A 4 in the next digit enables the X mask ram and a 1 in the next digit allows the X counter to increment. The 8 in the next digit selects C>R for the Y mux and the counter source selection bit 2 is set to 1. The next two digits are as before and the final digit selects a jump control of YREG=∅. The μinstruction programming is:

BFR ∅ μP 3 2118148

In the 3rd pass, we want X and Y registers to decrement, both X and Y mask rams enabled, and X and Y muxs selected at the No. 3 position (11) giving 7878 for the 1st four digits. The next two are the same and the final digit selects a jump control of X and Y REG=∅. Programming is:

BFR ∅ μP 4 1117878

The final microinstruction to consider is number 1 labled PRESET. In this μinstruction the control bits and clock are generated to preset both X and Y counters. This is accomplished with a 3 in digits 1 and 3 and a 3 to select the counter clear always position, yielding:

BFR ∅ μP 1 ∅∅3∅3∅3

This completes coding of the μPR. Presetting the X and Y counters and registers before execution is accomplished as follows:

BFR ∅ XC ∅∅
BFR ∅ XR ∅4
BFR ∅ YC ∅∅
BFR ∅ YR ∅4

Thus far, the coding for loading the PPG and ECAPS pattern has been generated. It is as follows:

PPG ∅ PM ∅ ∅4∅∅∅∅F∅F∅F∅1∅∅
PPG ∅ PM 1 ∅83∅∅22∅2∅∅∅14∅
PPG ∅ PM 2 ∅C11∅22∅2∅∅∅14∅
PPG ∅ PM 3 184∅∅∅F∅F∅∅∅∅C∅
PPG ∅ PM 4 145∅∅∅∅∅∅∅∅∅1C∅
PPG ∅ PM 5 186∅∅∅∅∅∅∅∅∅1C∅
PPG ∅ PM 6 1C8∅∅∅222∅∅∅1C∅
PPG ∅ PM 7 2∅63∅∅222∅∅∅1C∅
PPG ∅ PM 8 2C9∅∅∅F∅F∅∅∅∅C∅
PPG ∅ PM 9 28A∅∅∅∅∅∅∅∅∅24∅
PPG ∅ PM 10 2CB∅∅∅∅∅∅∅∅∅24∅
PPG ∅ PM 11 316∅∅22∅2∅∅∅24∅
PPG ∅ PM 12 34B1∅22∅2∅∅∅24∅
PPG ∅ PM 13 ∅∅∅F∅∅∅∅∅∅∅∅∅∅
PPG ∅ PM 22 ∅∅∅F∅∅∅∅∅∅∅C∅∅
PPG ∅ XR 1 ∅∅∅∅∅∅
PPG ∅ YR 1 ∅∅∅∅∅∅
BFR ∅ μP 1 ∅∅3∅3∅3
BFR ∅ μP 2 311∅881
BFR ∅ μP 3 2118148
BFR ∅ μP 4 1117878
BFR ∅ XC ∅∅
BFR ∅ XR ∅4
BFR ∅ YC ∅∅
BFR ∅ YR ∅4

To execute the algorithm, the TSLANG command RUN is used. Inhibit fail (IF) is programmed in order to prevent an automatic abort when fails are encountered. The pattern is loaded in block ∅ and starting address ∅ and thus the command is:

RUN ∅/∅ IF

Following execution of the PPA (Post Processing Algorithm), the PFLAG (Pattern generator flag bit) will be set if the part was found to be non repairable or if repairable, the X and Y mask rams will contain one's for each row and column that needs to be replaced. The program to read the PFLAG and the X and Y mask rams is as follows: The TSLANG Command PFLAG causes the PPG flags to be read and stored in the CCU memory. The CALL PFLAG X LABEL command is a conditioned call to a label based on the specified PFLAG. For example,
    CALL PFLAG 1 MSG1 will execute a CALL to the LABEL MSG1 if the PFLAG1 bit is set. Thus, to print out a message based on the PFLAG, the program is as follows:
PFLAG
CALL PFLAG1 MSG1

LABEL MSG1
PRINT 'MEMORY NONREPAIRABLE'
RETURN

To read out the X and Y mask rams, set the initial address at zero (board reset), set the BFCNT bit for increment and clock the address counter with the BFCK bit. The rams are read out with "read 7" (MEM FØB7), and the output is compared to a XMSK fail (FE), a YMSK fail (FD) and a both fail (FC). It it gets a XMSK fail, it will print out the number of the failing row and conversely, for a YMSK fail, it will print the failing column. Two passes will be made through the rams (X=1 to 2) with failed rows printed out the 1st pass and failed column on the second pass. The rams are 256 bits deep and thus Y=Ø to 255. The TSLANG program to perform the read is shown below:

```
FOR X=1 TO 2
MEM FØBØ ØØ                  (board reset)
BFR Ø μP Ø 7FFØØØØ           (initialize μPR)
IF X=1 PRINT 'REPLACE ROW:',
IF X=1 LET J= FE             (XMSK FAIL)
IF X=1 LET K= FE             (X AND Y MSK FAIL)
IF X=2 PRINT 'REPLACE COLUMN=:',
IF X=2 LET J= FD             (Y MSK FAIL)
FOR Y=Ø TO 255               (SCAN ALL MSK RAM ADDRS)
LET U=MEM (FØB7)             (READ OUT MSK RAMS)
IF U=J PRINT , Y,',',        (COMPARE TO XMSK FAIL 1ST PASS,
                              PRINT FAILED ROW)
IF U=K PRINT ,Y,',',         (as above)
MEM FØBC ØØ                  (INCREMENT MSK RAM ADDRESS)
NEXT Y                       (loop back to "FOR Y")
PRINT                        (line feed, carriage return)
NEXT X                       (loop to FOR X for 2nd pass)
```

The entire PPA including output display of the result can be made a subroutine with the addition of a label (LABEL PPA), a few timing statements, and a return. The complete code follows:

```
LABEL PPA
TIME CY Ø 13Ø NS
TIME ES Ø 25 NS
PPG Ø PM Ø  Ø4ØØØØFØFØFØ1ØØ
PPG Ø PM 1  Ø83ØØ22Ø2ØØØ14Ø
PPG Ø PM 2  ØC11Ø22Ø2ØØØ14Ø
PPG Ø PM 3  184ØØØFØFØØØØCØ
PPG Ø PM 4  145ØØØØØØØØØ1CØ
PPG Ø PM 5  186ØØØØØØØØØ1CØ
PPG Ø PM 6  1C8ØØØ222ØØØ1CØ
PPG Ø PM 7  2Ø63ØØ222ØØØ1CØ
PPG Ø PM 8  2Ø9ØØØFØFØØØØCØ
PPG Ø PM 9  28AØØØØØØØØØ24Ø
PPG Ø PM 1Ø 2CBØØØØØØØØØ24Ø
PPG Ø PM 11 316 ØØ22Ø2ØØØ24Ø
PPG Ø PM 12 34B1Ø22Ø2ØØØ24Ø
PPG Ø PM 13 ØØØFØØ519 ØØØØØØØØ
PPG Ø PM 22 ØØØFØØØØØØØØCØØ
PPG Ø XR 1 ØØØØØØ
PPG Ø YR 1 ØØØØØØ
BFR Ø μP Ø 7ØØFFFF
BFR Ø μP 1 ØØ3Ø3Ø3
BFR Ø μP 2 311Ø881
BFR Ø μP 3 2118148
BFR Ø μP 4 1117878
BFR Ø XC ØØ
BFR Ø XR Ø4
BFR Ø YC ØØ
BFR Ø YR Ø4
RUN Ø/Ø IF
PFLAG
CALL PFLAG1 MSG1
MEM FØBØ ØØ
FOR X=1 TO 2
IF X=1 PRINT 'REPLACE ROW:'
IF X=1 LET J=$FE
IF X=1 LET K=$FC
IF X=2 PRINT 'REPLACE COLUMN:',
IF X=2 LET J=$FD
FOR Y=Ø TO 255
LET U=MEM ($FØB7)
IF U=J PRINT, Y,',',
IF U=K PRINT, Y,',',
MEM FØBC ØØ
NEXT Y
PRINT
NEXT X
RETURN
```

LABEL MSG1
PRINT 'MEMORY NONREPAIRABLE'
RETURN

This completes the example of a Post Processing Algorithm.

Although, as thus far described, "row" has been used to designate the horizontal linear arrays of memory elements, whereas, "column" has been used to designate the vertical linear arrays of memory elements, that is not a requirement and these terms may be interchanged one for the other. As used herein and in the claims, "row" and "column" merely designate first and second linear arrays of memory elements within a matrix of memory elements, the first array being angularly displaced relative to the second array.

An advantage to the masking feature of the present invention, when compared to the prior art wherein the failure image was stored and repaired in the second memory is that masking the rows and/or columns to be replaced, as contrasted with repair of the image, greatly reduces the time for making the repair analysis. In addition masking as opposed to altering the image in the second memory allows much greater flexibility in the analysis since the original image is not changed. For example by masking, the analysis, if not successful in effecting a repair when analyzed starting from one corner of the matrix can restart from any one or more of the other corners of the matrix. This flexibility is not available if the image has been altered during the analysis.

What is claimed is:

1. In a method for analyzing failures in a memory under test having a matrix of row and column memory elements with spare row and/or column memory elements to determine repairability, the steps of:
   testing the memory matrix to derive failure test data representative of the row and column location in the memory array of faulty individual memory elements;
   storing the row and column test data in a second memory with the same row and column correspondence with that of the memory under test;
   counting the detected number of faulty memory elements per row;
   flagging a row for replacement when the detected failures per row exceeds a certain number greater than one;
   scanning the row and column data in the second memory column-by-column for detecting faulty memory elements per column;
   counting the detected number of faulty memory elements per column;
   masking the counting of failures in rows flagged for replacement such that such failures are not counted when scanning column-by-column; and
   flagging that column for replacement when the counted unmasked failures per column exceeds a certain number greater than one.

2. The method of claim 1 including the steps of:
   scanning the row and column data in the second memory row-by-row for a second time for detecting faulty memory elements per row;
   masking the detection of failures in flagged columns and rows; and
   flagging each row for replacement having a detected unmasked faulty memory element therein.

3. The method of claim 2 including the steps of, keeping a count of the number of unused spare row and columns of memory elements;
   decreasing the count of the number of unused spare rows by one for each such flagged row until all spare rows are used up;
   flagging additionally detected unmasked failures per row for replacement by an unused spare column; thereafter
   decreasing the count of the number of unused spare columns by one for each such column flagged for replacement until the count of the number of unused spare columns are used up; and thereafter
   flagging the memory under test as non-repairable with the detection of an additional unmasked failure per row.

4. In a memory tester for testing and analyzing the failures in a memory under test to determine repairability, said memory having a matrix of row and column memory elements and spare rows and columns of memory elements;
   testing means for testing the memory matrix to derive failure test data representative of the row and column locations in the memory matrix of faulty individual memory elements;
   second memory means for receiving from said testing means and for storing the failure test data with the same row and column correspondence with that of the memory elements in the memory under test;
   accessing means for accessing the test result data stored in said second memory row-by-row and for determining faulty memory elements per row in the memory under test;
   counting means for counting the number of failures per row;
   flagging means for flagging a row for replacement when the number of detected failures in the accessed row exceeds a certain number;
   accessing means for accessing the test result data stored in said second memory column-by-column and for detecting faulty memory elements per column in the memory under test; and
   masking means responsive to the output of said flagging means for masking the counting of memory element failures in flagged rows.

5. The apparatus of claim 4 including second counting means for counting the number of failures per column;
   second flagging means for flagging a column for replacement when the number of detected failures in the accessed column exceeds a certain number; and
   second masking means responsive to an output of said second flagging means for masking the counting of flagged memory element failures per acccessed column.

6. The apparatus of claim 4 including,
   register means for keeping track of the number of unused spare memory rows; and
   decrementing means for decrementing said register means in response to the output of said flagging means for keeping track of the number of unused spare rows.

7. The apparatus of claim 5 including, register means for keeping track of the number of unused spare memory columns; and
   decrementing means for decrementing said register means in response to the output of said second flagging means for keeping track of the number of unused spare columns.

* * * * *